US012805087B2

(12) United States Patent
Yan et al.

(10) Patent No.: US 12,805,087 B2

(45) Date of Patent: Nov. 17, 2026

(54) ELECTRONIC DEVICES AND MANUFACTURING METHOD THEREOF

(71) Applicant: InnoLux Corporation, Miao-Li County (TW)

(72) Inventors: Tzu-Min Yan, Miao-Li County (TW); Yan-Tang Dai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 387 days.

(21) Appl. No.: 18/500,363

(22) Filed: Nov. 2, 2023

(65) Prior Publication Data

US 2024/0186476 A1 Jun. 6, 2024

(30) Foreign Application Priority Data

Dec. 6, 2022 (CN) ......................... 202211557000.2

(51) Int. Cl.

*H10H 20/857* (2025.01)

*H10H 20/01* (2025.01)

(52) U.S. Cl.

CPC .......... *H10H 20/857* (2025.01); *H10H 20/01* (2025.01); *H10H 20/0364* (2025.01)

(58) Field of Classification Search

None

See application file for complete search history.

(56) References Cited

U.S. PATENT DOCUMENTS 3,402,331 A * 9/1968 Rittner ..................... H05K 1/16 257/66

4,304,450 A * 12/1981 Bilsback ................. H01J 9/261 445/24

(Continued)

FOREIGN PATENT DOCUMENTS

CN 212810308 U 3/2021

CN 113437025 A 9/2021

(Continued)

OTHER PUBLICATIONS

Original and Translation of CN113437025 (Year: 2021).*

(Continued)

*Primary Examiner* — Timothy J. Dole

*Assistant Examiner* — Muhammed Azam

(74) *Attorney, Agent, or Firm* — McClure, Qualey & Rodack, LLP

(57) ABSTRACT

An electronic device includes a first substrate having a first surface, a second surface opposite to the first surface, and a side surface between the first surface and the second surface. The electronic device includes a first conductive pattern disposed on the first surface, and a side conductive pattern disposed on the side surface and the first surface. The side conductive pattern is electrically connected to the first conductive pattern. The side conductive pattern includes a first side conductive line and a second side conductive line. A first overlapping portion of the first side conductive line and the first conductive pattern has a first length, a second overlapping portion of the second side conductive line and the first conductive pattern has a second length, and the first length is different from the second length.

12 Claims, 12 Drawing Sheets

(56) References Cited

U.S. PATENT DOCUMENTS

| | | | | |
|---|---|---|---|---|
| 7,221,012 | B2 * | 5/2007 | Chu | H10D 86/443 257/E27.111 |
| 7,258,549 | B2 * | 8/2007 | Asahi | H05K 3/403 439/91 |
| 7,688,177 | B2 * | 3/2010 | Saito | H01C 7/18 338/21 |
| 9,179,539 | B2 * | 11/2015 | Akahoshi | H05K 1/0248 |
| 9,331,082 | B2 * | 5/2016 | Lee | H10B 41/50 |
| 9,337,442 | B2 * | 5/2016 | Kao | H10K 59/131 |
| 10,522,511 | B2 * | 12/2019 | Kim | H10W 90/00 |
| 10,811,386 | B2 * | 10/2020 | Chiu | H10W 74/141 |
| 10,935,828 | B2 * | 3/2021 | Jeong | G02F 1/13336 |
| 10,978,384 | B2 * | 4/2021 | Kim | G11C 5/063 |
| 11,217,564 | B2 * | 1/2022 | Choi | H10W 90/00 |
| 11,430,721 | B2 * | 8/2022 | Gokan | H10W 90/811 |
| 11,436,981 | B2 * | 9/2022 | Bai | G11C 19/28 |
| 11,538,849 | B2 * | 12/2022 | Cok | H10H 29/10 |
| 11,984,404 | B2 * | 5/2024 | Park | H10B 43/10 |
| 12,400,891 | B2 * | 8/2025 | Antoniolli | C23C 14/042 |
| 2002/0044331 | A1 * | 4/2002 | Agrawal | H01M 14/005 359/254 |
| 2002/0047210 | A1 * | 4/2002 | Yamada | H10D 62/117 257/784 |
| 2009/0026628 | A1 * | 1/2009 | Lee | H10W 20/40 257/E23.024 |
| 2010/0207240 | A1 * | 8/2010 | Hashimoto | H10B 43/27 257/532 |
| 2015/0179564 | A1 * | 6/2015 | Lee | H10B 41/50 257/773 |
| 2018/0263123 | A1 * | 9/2018 | Chen | G02F 1/1345 |
| 2020/0152896 | A1 * | 5/2020 | Jung | G09G 3/3225 |
| 2020/0259056 | A1 * | 8/2020 | Hong | H10H 20/857 |
| 2021/0399185 | A1 * | 12/2021 | Liu | G02F 1/1345 |
| 2022/0052241 | A1 | 2/2022 | Lu et al. | |
| 2022/0359790 | A1 * | 11/2022 | Lee | H10H 20/8312 |
| 2023/0223327 | A1 * | 7/2023 | Park | H10W 70/65 257/690 |
| 2024/0186476 | A1 * | 6/2024 | Yan | H05K 3/403 |
| 2024/0213265 | A1 * | 6/2024 | Hosaka | H10K 59/131 |
| 2025/0157901 | A1 * | 5/2025 | Dai | H10W 70/658 |
| 2026/0040791 | A1 * | 2/2026 | Wu | G02F 1/1323 |

FOREIGN PATENT DOCUMENTS

| | | | |
|---|---|---|---|
| CN | 113644085 | A | 11/2021 |
| CN | 114594624 | A | 6/2022 |
| KR | 20200145809 | A | 12/2020 |
| TW | 202205917 | A | 2/2022 |

OTHER PUBLICATIONS

Original and Translation of CN114594624 (Year: 2022).*
Original and Translation of KR20200145809 (Year: 2020).*
Partial European Search Report dated May 3, 2024, issued in application No. EP 23210146.9.
Chinese language office action dated May 31, 2025, issued in application No. TW 112106900.
Extended European Search Report dated Oct. 1, 2024, issued in application No. EP 23210146.9.

* cited by examiner

ELECTRONIC DEVICES AND MANUFACTURING METHOD THEREOF

CROSS REFERENCE TO RELATED APPLICATIONS

This Application claims priority of China Patent Application No. 202211557000.2, filed on Dec. 6, 2022, the entirety of which is incorporated by reference herein.

TECHNICAL FIELD

Some embodiments of the present disclosure relate to electronic devices and the manufacturing method thereof, and, in particular, to electronic devices including a side conductive pattern, and a manufacturing method thereof.

BACKGROUND

Electronic devices are widely used in consumer electronic products such as smartphones and wearable devices. In order to provide consumers with electronic devices with excellent characteristics, improvements in the structural design and manufacturing processes of electronic devices have attracted widespread attention.

For example, electronic devices usually include various conductive patterns to electrically connect various electronic elements via the conductive patterns. However, the reliability of the conductive patterns in current electronic devices may be affected by the alignment process, the formation process, and the like, so that the electronic device is prone to issues such as short-circuiting, open-circuits, high impedance, and/or reliability concerns.

Although existing electronic devices and manufacturing methods thereof have been adequate for their intended purposes, they have not been entirely satisfactory in all respects. There are still some problems to be overcome with respect to electronic devices and manufacturing methods thereof.

SUMMARY

In some embodiments, an electronic device is provided. The electronic device includes a first substrate, a first conductive pattern, and a side conductive pattern. The first substrate has a first surface, a second surface opposite to the first surface, and a side surface between the first surface and the second surface. The first conductive pattern is disposed on the first surface. The side conductive pattern is disposed on the side surface and the first surface. The side conductive pattern is electrically connected to the first conductive pattern. The side conductive pattern includes a first side conductive line and a second side conductive line. A first overlapping portion of the first side conductive line and the first conductive pattern has a first length, a second overlapping portion of the second side conductive line and the first conductive pattern has a second length, and the first length is different from the second length.

In some embodiments, a manufacturing method for an electronic device is provided. A first substrate is provided. The first substrate includes a first surface, a second surface, and a side surface. The first surface is opposite to the second surface, and the side surface is between the first surface and the second surface. A first conductive pattern is formed on the first surface of the first substrate. A first protective film is formed on the first conductive pattern. An edge of the first protective film has at least one concave portion and at least one convex portion adjacent to the at least one concave portion on the first surface. A conductive layer is formed on the side surface and the first surface. The first protective film is removed. The conductive layer is patterned to form a side conductive pattern connected to the first conductive pattern.

In some embodiments, an electronic device is provided. The electronic device includes a first substrate, a first conductive pattern, and a side conductive pattern. The first substrate has a first surface, a second surface opposite to the first surface, and a side surface between the first surface and the second surface. The first conductive pattern is disposed on the first surface. The side conductive pattern is disposed on the side surface. The side conductive pattern is electrically connected to the first conductive pattern, and the side conductive pattern includes a first side conductive line. The first conductive pattern covers a portion of the first side conductive line.

The electronic devices and the manufacturing method thereof of the present disclosure may be applied in various types of electronic apparatus. In order to make the features and advantages of some embodiments of the present disclosure more understand, some embodiments of the present disclosure are listed below in conjunction with the accompanying drawings, and are described in detail as follows.

BRIEF DESCRIPTION OF THE DRAWINGS

The present disclosure can be more fully understood from the following detailed description when read in conjunction with the accompanying drawings. It should be noted that, according to the standard practice in the industry, the various features are not drawn to scale. In fact, the dimensions of the various features may be arbitrarily increased or reduced for clarity.

DETAILED DESCRIPTION

Figure 1A:
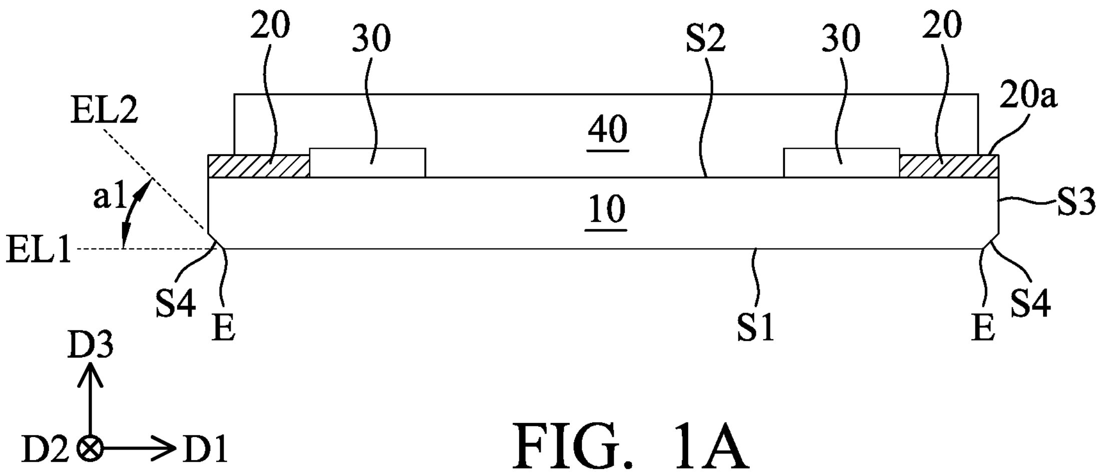
FIG. 1A to FIG. 1F are schematic cross-sectional views respectively showing an electronic device at different stages of a manufacturing method according to some embodiments of the present disclosure.

Electronic devices and the manufacturing method thereof of various embodiments of the present disclosure will be described in detail below. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar or corresponding reference numerals may be used in different embodiments to designate similar or corresponding elements in order to clearly describe the present disclosure. However, the use of these similar or corresponding reference numerals is only for the purpose of simply and clearly description of some embodiments of the present disclosure, and does not imply any correlation between the different embodiments or structures discussed.

It should be understood that relative terms, such as "lower", "bottom", "higher", or "top" may be used in various embodiments to describe the relative relationship of one element of the drawings to another element. It will be understood that if the device in the drawings were turned upside down, elements described on the "lower" side would become elements on the "upper" side. The embodiments of the present disclosure can be understood together with the drawings, and the drawings of the present disclosure are also regarded as a portion of the disclosure.

Furthermore, when it is mentioned that a first material layer is located on or over a second material layer, it may include the embodiment which the first material layer and the second material layer are in direct contact and the embodiment which the first material layer and the second material layer are not in direct contact with each other, that is one or more layers of other materials is between the first material layer and the second material layer. However, if the first material layer is directly on the second material layer, it means that the first material layer and the second material layer are in direct contact.

In addition, it should be understood that ordinal numbers such as "first", "second", and the like used in the description and claims are used to modify elements and are not intended to imply and represent the element(s) have any previous ordinal numbers, and do not represent the order of a certain element and another element, or the order of the manufacturing method, and the use of these ordinal numbers is only used to clearly distinguished an element with a certain name and another element with the same name. The claims and the specification may not use the same terms, for example, a first element in the specification may be a second element in the claim.

In some embodiments of the present disclosure, terms related to connection and bonding, such as "connect" and "bond", and the like, unless otherwise defined, may refer to two structures in direct contact, or may also refer to two structures not in direct contact, that is there is another structure disposed between the two structures. Furthermore, the terms "electrically connected" include any direct and indirect means of electrical connection.

Herein, the terms "about" and "substantially" generally mean within 10%, within 5%, within 3%, within 2%, within 1%, or within 0.5% of a given value. The given value is an approximate value, that is, "about" and "substantially" can still be implied without the specific description of "about" and "substantially". The term "a range between a first value and a second value" means that the range includes the first value, the second value, and other values in between. Furthermore, any two values or directions used for comparison may have certain tolerance. If the first value is equal to the second value, it implies that there may be a tolerance within about 10%, within 5%, within 3%, within 2%, within 1%, or within 0.5% between the first value and the second value.

Certain terms may be used throughout the specification and claims in the present disclosure to refer to specific elements. A person of ordinary skills in the art should be understood that electronic device manufacturers may refer to the same element by different terms. The present disclosure does not intend to distinguish between elements that have the same function but with different terms. In the following description and claims, terms such as "include", "comprise", and "have" are open-ended words, so they should be interpreted as meaning "includes but not limited to . . . ". Therefore, when the terms "include", "comprise", and/or "have" is used in the description of the present disclosure, it designates the presence of corresponding features, regions, steps, operations, and/or elements, but does not exclude the presence of one or more corresponding features, regions, steps, operations, and/or elements.

Unless otherwise defined, all terms (including technical and scientific terms) used herein have the same meaning as commonly understood by a person of ordinary skills in the art. It is understood that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

Herein, the respective directions are not limited to three axes of the rectangular coordinate system, such as the X-axis, the Y-axis, and the Z-axis, and may be interpreted in a broader sense. For example, the X-axis, the Y-axis, and the Z-axis may be perpendicular to each other, or may represent different directions that are not perpendicular to each other, but the present disclosure is not limited thereto. For convenience of description, hereinafter, the X-axis direction is the first direction (the length direction) D1, the Y-axis direction is the second direction (the width direction) D2, and the Z-axis direction is the third direction (the thickness direction) D3. In some embodiments, the schematic cross-sectional views described herein are schematic views of the XZ plane. In some embodiments, a normal direction of the first substrate 10 may be the third direction D3. It should be understood that a scanning electron microscope (SEM), an optical microscope (OM), or other suitable methods can be used to measure the length, width, thickness, and other parameters of each element according to the embodiments of the present disclosure.

In some embodiments, the electronic device of the present disclosure may include a display device, a lighting device, an antenna device, a sensing device, or a titling device, but the present disclosure is not limited thereto. The electronic device may be a foldable or flexible electronic device. The display device may be a non-self-luminous display device or a self-luminous display device. The antenna device may be a liquid-crystal antenna device or a non-liquid-crystal antenna device. The sensing device may be a sensing device for sensing capacitance, light, heat, or ultrasonic waves, but the present disclosure is not limited thereto. The electronic elements may include passive elements and active elements, such as semiconductor chips, capacitors, resistors, inductors, diodes, transistors, and the like. The diodes may include light-emitting diodes (LEDs) or photodiodes (PDs). The light-emitting diodes may include, for example, organic light-emitting diodes (OLEDs), mini light-emitting diodes (mini LEDs), micro light-emitting diodes (micro LEDs), or quantum dot light-emitting diodes (quantum dot LEDs), but the present disclosure is not limited thereto. The titling device may be, for example, a display titling device or an antenna titling device, but the present disclosure is not limited thereto. It should be noted that, the electronic device can be any arrangement and combination of the foregoing, but the present disclosure is not limited thereto. The content of the present disclosure will be described below with an electronic device including electronic element, but the present disclosure is not limited thereto. In addition, the shape of the electronic device may be rectangular, circular, polygonal, a shape with curved edges, or another suitable shape. The electronic device may have a peripheral system, such as a processing system, a driving system, a controlling system, a light source system, a shelf system, or the like to support the electronic device.

In some embodiments, additional processing steps may be provided before, during, and/or after a manufacturing method of an electronic device. In some embodiments, some of the described processing steps may be replaced or omitted, and the order of some of the described processing steps may be interchangeable. Furthermore, it should be understood that some of the described processing steps may be replaced or deleted for other embodiments of the method. Moreover, in the present disclosure, the number and size of each component in the drawings are only for illustration, and are not used to limit the scope of the present disclosure.

FIG. 1A to FIG. 1F are schematic cross-sectional views respectively showing an electronic device at different stages of a manufacturing method according to some embodiments of the present disclosure. Therefore, the first substrate 10, the first conductive pattern 50, the side conductive pattern 70, and the second conductive pattern 20 of the electronic device 1 may be described in detail with reference to FIG. 1A to FIG. 1F.

As shown in FIG. 1A, in some embodiments, the electronic device 1 may include a first substrate 10. As shown in FIG. 1A, in some embodiments, the first substrate 10 may have a first surface S1, a second surface S2 opposite to the first surface S1, and a side surface S3 between the first surface S1 and the second surface S2. For example, in the third direction D3, the first surface S1 of the first substrate 10 may be the bottom surface of the first substrate 10, and the second surface S2 of the first substrate 10 may be the top surface of the first substrate 10. In some embodiments, the first substrate 10 may include a foldable substrate, a flexible substrate, a rigid substrate, or a combination thereof, but the present disclosure is not limited thereto. In some embodiments, the first substrate 10 may include glass, quartz, sapphire, ceramics, polyimide (PI), polycarbonate (PC), polyethylene terephthalate (PET), polypropylene (PP), other suitable materials, or a combination thereof, but the present disclosure is not limited thereto. In some embodiments, the first substrate 10 may include a transparent substrate, a semi-transparent substrate, or an opaque substrate.

In some embodiments, the first substrate 10 may further include at least one chamfered surface S4, and the chamfered surface S4 may be located between the first surface S1 and the side surface S3. Although the number of chamfered surfaces S4 on one side of the first substrate 10 is 1 in FIG. 1A, the number of chamfered surfaces S4 on the one side of the first substrate 10 is greater than or equal to 2 since the first substrate 10 may undergo multiple edge grinding processes in other embodiments. For example, the number of chamfered surfaces S4 of the first substrate 10 may be 2, 3, 4, 5, 6, 7, 8, 9, 10, another suitable number, or another positive integer, but the present disclosure is not limited thereto. In some embodiments, there is an edge E between the chamfered surface S4 and the first surface S1 of the first substrate 10. A virtual extension line EL1 of the first surface S1 starting from the edge E and a virtual extension line EL2 of the chamfered surface S4 of the first substrate 10 may have an included angle. The angle a1 of the included angle may be greater than or equal to 30 degrees and less than or equal to 60 degrees (30 degrees≤a1≤60 degrees). For example, the angle a1 of the included angle may be 30 degrees, 35 degrees, 40 degrees, 45 degrees, 50 degrees, 55 degrees, 60 degrees, or any value or any range of values between the aforementioned values, but the present disclosure is not limited thereto. It should be noted that when the first substrate 10 has multiple chamfered surfaces S4 on one side, the included angle measured in the above manner is the representative angle of the chamfered surfaces S4. In addition, the first conductive pattern 50 may or may not extend to the edge E. Moreover, in some embodiments, the included angles corresponding to the chamfered surfaces S4 on each side of the first substrate 10 may be different. Further, in some embodiments, there may be another chamfered surface between the second surface S2 and the side surface S3. In some embodiments, the chamfered surface S4 may be omitted.

As shown in FIG. 1A, in some embodiments, the second conductive pattern 20 may be formed on the second surface S2 of the first substrate 10. In some embodiments, the second conductive pattern 20 may include conductive material. The conductive materials may include copper (Cu), aluminum (Al), molybdenum (Mo), tungsten (W), gold (Au), silver (Ag), chromium (Cr), nickel (Ni), platinum (Pt), titanium (Ti), iridium (Ir), rhodium (Rh), alloys thereof, other suitable conductive materials, or a combination thereof, but the present disclosure is not limited thereto. In some embodiments, the second conductive pattern 20 may include a multi-layer structured conductive film. In some embodiments, the multi-layer structured conductive film may include a low-impedance layer (not shown) and a buffer layer (not shown) disposed on the low-impedance layer. In some embodiments, the low-impedance layer may include a lower impedance metal such as copper, aluminum, silver, or the like. In some embodiments, the buffer layer may include an adhesive layer, an antioxidant layer, other functional layers, or a combination thereof, but the present disclosure is not limited thereto. The adhesive layer may improve the bonding between the low-impedance layer and other components. The antioxidant layer may protect the low-impedance layer from being oxidized and affecting the electrical properties of the low-impedance layer. For example, the buffer layer may include molybdenum, titanium, gold, platinum, or the like. In some embodiments, the multi-layer structured conductive film may include a first buffer layer (not shown), a low-impedance layer (not shown), and a second buffer layer (not shown) sequentially disposed along the third direction D3. In some embodiments, the first buffer layer or the second buffer layer may be omitted.

In some embodiments, the conductive material layer of the second conductive pattern 20 may be formed on the second surface S2 of the first substrate 10 by a deposition process. Then, a patterning process is performed on the conductive material layer of the second conductive pattern 20 to form the second conductive pattern 20. For example, the deposition process may include a chemical vapor deposition (CVD) process, a physical vapor deposition (PVD) process, a sputtering process, other suitable deposition processes, or a combination thereof, but the present disclosure is not limited thereto. The patterning process may include etching process, lift-off (lifting-off) process, laser process (for example, maskless patterning process), other suitable patterning processes, or a combination thereof, but the present disclosure is not limited thereto.

As shown in FIG. 1A, in some embodiments, an electronic element 30 may be formed on the second surface S2 of the first substrate 10, and the electronic element 30 may be electrically connected to the second conductive pattern 20. In some embodiments, electronic element 30 may include a transistor such as a thin film transistor (TFT). For example, the electronic element 30 may be a driving TFT, a controlling TFT, other suitable TFTs, or a combination thereof, but the present disclosure is not limited thereto. In some embodiments, the first substrate 10, the second conductive pattern 20, and the electronic element 30 may be collectively referred to as a thin film transistor substrate (TFT substrate).

As shown in FIG. 1A, in some embodiments, a second protective film 40 is formed on the second conductive pattern 20 and the electronic element 30. In some embodiments, the second protective film 40 may include wet photoresist, dry film photoresist, protective adhesive, or a combination thereof. In some embodiments, the second protective film 40 may include organic materials, inorganic materials, the like, or a combination thereof, but the present disclosure is not limited thereto. In some embodiments, the second protective film 40 may include epoxy resin, silicone resin, benzocyclobutene (BCB), polyimide (PI), polybenzoxazole (PBO), oxides such as silicon oxide ($SiO_x$), nitrides such as silicon nitride ($SiN_x$), oxynitride such as silicon oxynitride ($SiO_xN_y$), other suitable protective materials, or a combination thereof, but the present disclosure is not limited thereto. In some embodiments, the second protective film 40 may be formed on the second conductive pattern 20 and the electronic element 30 by the deposition process. In some embodiments, the second protective film 40 may cover the electronic element 30 and a portion of the second conductive pattern 20 and may expose another portion of the second conductive pattern 20. Therefore, the second protective film 40 may protect the electronic element 30, and the second protective film 40 may expose an exposed surface 20*a* of the second conductive pattern 20 to be electrically connected with the subsequently formed side conductive pattern.

Figure 1B:
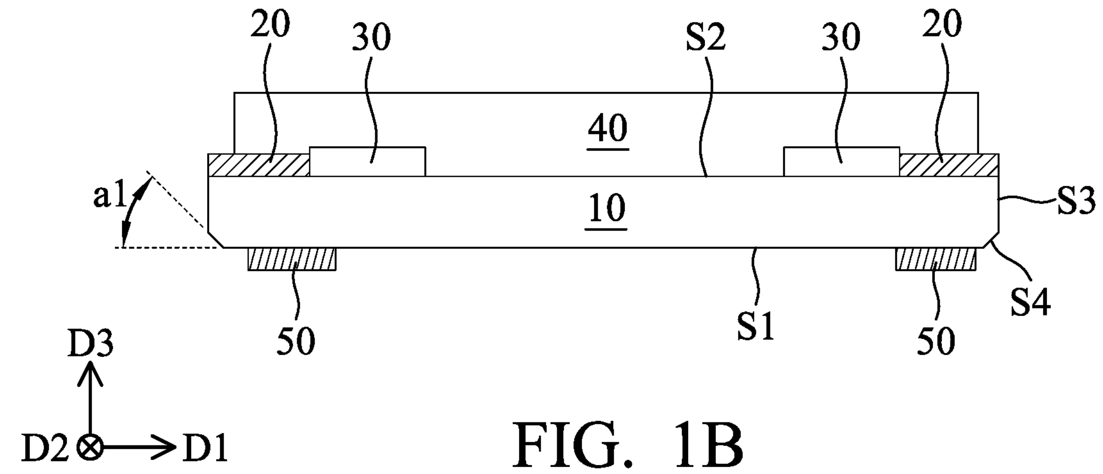

As shown in FIG. 1B, in some embodiments, a first conductive pattern 50 may be formed on the first surface S1 of the first substrate 10. In some embodiments, the material and formation method of the first conductive pattern 50 and the material and formation method of the second conductive pattern 20 may be the same or different. In some embodiments, the first conductive pattern 50 may include a conductive material, and the conductive material may include copper, aluminum, molybdenum, tungsten, gold, silver, chromium, nickel, platinum, titanium, iridium, rhodium, alloys thereof, other suitable conductive materials, or a combination thereof, but the present disclosure is not limited thereto. In some embodiments, the first conductive pattern 50 may include a multi-layer structured conductive film. In some embodiments, the multi-layer structured conductive film may include the aforementioned low-impedance layer and the aforementioned buffer layer disposed on the low-impedance layer.

In some embodiments, the conductive material layer of the first conductive pattern 50 may be formed on the first surface S1 of the first substrate 10 by the deposition process. Then, a patterning process is performed on the conductive material layer of the first conductive pattern 50 to form the first conductive pattern 50. For example, the deposition process may include a chemical vapor deposition process, a physical vapor deposition process, a sputtering process, other suitable deposition processes, or a combination thereof, but the present disclosure is not limited thereto. The patterning process may include an etching process, a lift-off process, a laser process, other suitable patterning processes, or a combination thereof, but the present disclosure is not limited thereto.

Figure 1C:
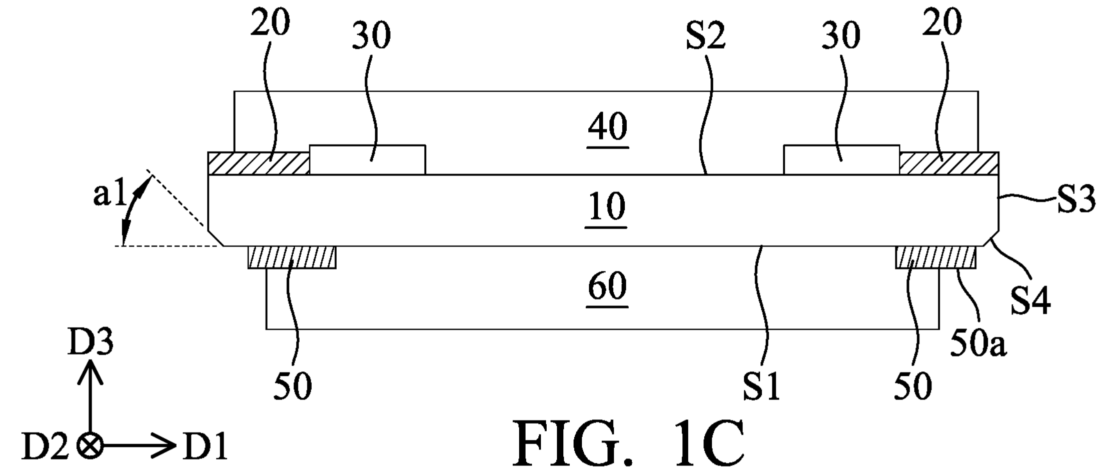

As shown in FIG. 1C, in some embodiments, a first protective film 60 may be formed on the first conductive pattern 50 and the first surface S1 of the first substrate 10. In some embodiments, the material and formation method of the first protective film 60 and the material and formation method of the second protective film 40 may be the same or different. In some embodiments, the first protective film 60 may include wet photoresist, dry film photoresist, protective adhesive, or a combination thereof. In some embodiments, the first protective film 60 may be formed on the first conductive pattern 50 by the deposition process. In some embodiments, the first protective film 60 may cover a portion of the first conductive pattern 50 and expose another portion of the first conductive pattern 50. Therefore, the first protective film 60 may expose an exposed surface 50*a* of the first conductive pattern 50 to be electrically connected with a subsequently formed side conductive pattern.

Figure 1D:
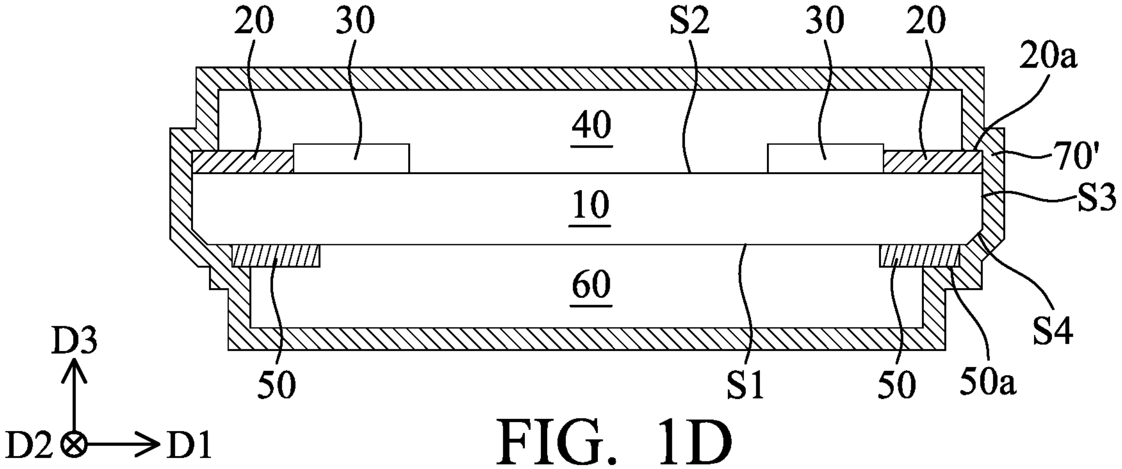

As shown in FIG. 1D, in some embodiments, a conductive layer 70' is formed on the side surface S3 between the first surface S1 and the second surface S2 and on the first surface S1. In some embodiments, the conductive layer 70' is conformally formed on the top surface and side surface of the second protective film 40, the exposed surface 20*a* of the second conductive pattern 20, the side surface S3, the chamfered surface S4, the exposed surface 50*a* of the first conductive pattern 50, and the top surface and the side surface of the first protective film 60.

In some embodiments, the material and formation method of the conductive layer 70' may be the same as or different from the material and formation method of the first conductive pattern 50 and/or the second conductive pattern 20. In some embodiments, the conductive layer 70' may include conductive materials, and the conductive materials may include copper, aluminum, molybdenum, tungsten, gold, silver, chromium, nickel, platinum, titanium, iridium, rhodium, alloys thereof, others suitable conductive materials, or a combination thereof, but the present disclosure is not limited thereto. In some embodiments, the conductive layer 70' may include a multi-layer structured conductive film. Therefore, the subsequently formed side conductive pattern may include the multi-layer structured conductive film. In some embodiments, the multi-layer structured conductive film may include the aforementioned low-impedance layer and the aforementioned buffer layer disposed on the low-impedance layer.

In some embodiments, the conductive layer 70' may be formed on the side surface S3 of the first substrate 10 by the deposition process. For example, the deposition process may include a chemical vapor deposition process, a physical vapor deposition process, a sputtering process, other suitable deposition processes, or a combination thereof, but the present disclosure is not limited thereto. In some embodiments, the conductive layer 70' may be formed by a sputtering process, so that the thickness of the conductive layer 70' may be adjusted by the parameters of the sputtering process. Since the thickness of the conductive layer 70' may be adjusted according to electrical requirements, an appropriate thickness (for example, an increased thickness) may be selected to reduce the impedance of the conductive layer 70' and/or improve the reliability of the conductive layer 70'.

Figure 1E:
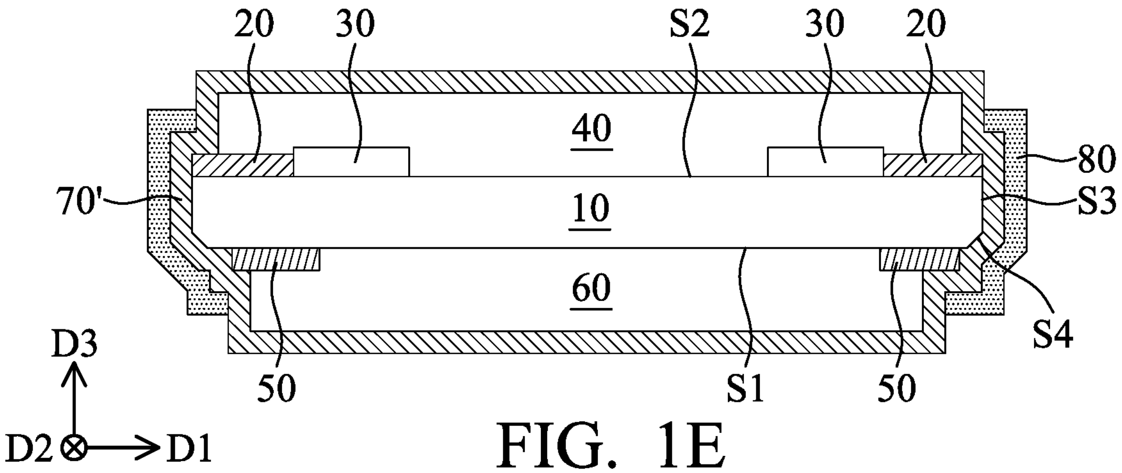
Figure 1F:
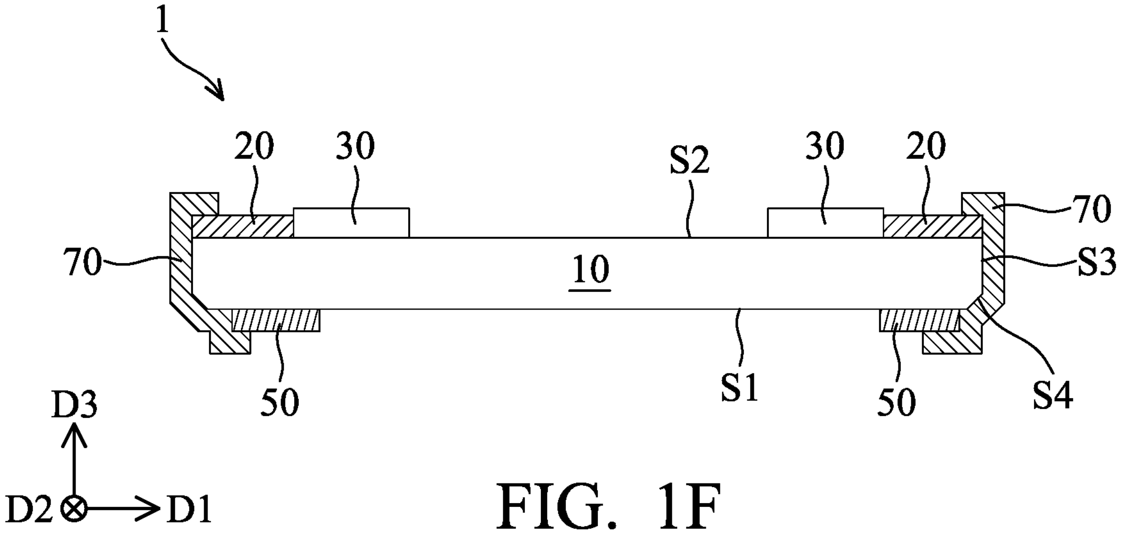

As shown in FIG. 1E, in some embodiments, a patterning process may be performed on the conductive layer 70' to form a side conductive pattern that electrically connects the first conductive pattern 50 and the second conductive pattern 20 (for example, the side conductive pattern 70 in FIG. 1F). For example, the patterning process may include an etching process, a lift-off process, a laser process, other suitable patterning processes, or a combination thereof, but the present disclosure is not limited thereto. In some embodiments, the conductive layer 70' may be patterned by an etching process, and details of the etching process will be described below.

As shown in FIG. 1E, in some embodiments, a photoresist layer 80 is formed on the conductive layer 70'. In some embodiments, the photoresist layer 80 may be a positive photoresist. The shape of the photoresist layer 80 may correspond to the shape of the subsequently formed side conductive pattern. In some embodiments, the photoresist layer 80 may cover the side surface S3 of the first substrate 10, and the photoresist layer 80 may expose the conductive layer 70' on the top surface of the second protective film 40 and the conductive layer 70' on the bottom surface of the first protective film 60.

As shown in FIG. 1F, in some embodiments, an etching process is performed to remove the conductive layer 70' not covered by the photoresist layer 80 to form the side conductive pattern 70. For example, the etching process may be a dry etching process, a wet etching process, other suitable etching processes, or a combination thereof, but the present disclosure is not limited thereto. In some embodiments, the side conductive pattern 70 may be formed on the first surface S1, the second surface S2, the side surface S3, and the chamfered surface S4 of the first substrate 10, and the side conductive pattern 70 may be electrically connected with the first conductive pattern 50 and the second conductive pattern 20. Then, the photoresist layer 80 is removed by a removal process such as an ashing process. Then, after the removal of the photoresist layer 80, the first protective film 60 and the second protective film 40 are removed to expose the first surface S1 and the second surface S2 of the first substrate 10, and the electronic device 1 is obtained.

As shown in FIG. 1F, in some embodiments, the first conductive pattern 50, the second conductive pattern 20, and the side conductive pattern 70 of the electronic device 1 may be formed separately from each other. In some embodiments, the side conductive pattern 70 may cover the top surface of the second conductive pattern 20 in the third direction D3. In other words, the side conductive pattern 70 may have an overlapping portion overlapping the second conductive pattern 20. Therefore, when the side conductive pattern 70 is electrically connected to the second conductive pattern 20, the impedance may be reduced. In some embodiments, in the third direction D3, the side conductive pattern 70 may cover the bottom surface of the first conductive pattern 50 (that is, the surface of the first conductive pattern 50 which does not be in contact with the first surface S1 of the first substrate 10). In other words, the side conductive pattern 70 may have an overlapping portion overlapping the first conductive pattern 50. Therefore, when the side conductive pattern 70 is electrically connected to the first conductive pattern 50, the impedance may be reduced. Moreover, since the side conductive pattern 70 may have an overlapping portion that overlaps the first conductive pattern 50 and/or the second conductive pattern 20, the possibility of a short-circuit and/or an open-circuit developing in the electronic device 1 may be reduced. Furthermore, since the side conductive pattern 70 may be formed by the sputtering process and may cover the chamfered surface S4, the side conductive pattern 70 may improve the reliability of the wiring at the chamfered surface S4, thereby reducing the possibility of a short-circuit and/or an open-circuit developing in the electronic device 1.

FIG. 2A to FIG. 2F are schematic cross-sectional views respectively showing an electronic device at different stages of a manufacturing method according to some embodiments of the present disclosure. Hereinafter, for the sake of brevity, descriptions of elements designated by the same or similar reference numerals will not be repeated. Except for the number of first conductive patterns 50, the contents shown in FIG. 2A to FIG. 2C correspond to the respective contents shown in FIG. 1A to FIG. 1C, and details are not repeated here. In some embodiments, the conductive layer 70' may be patterned by the lift-off process, and the details of the lift-off process are described below.

Figure 2A:
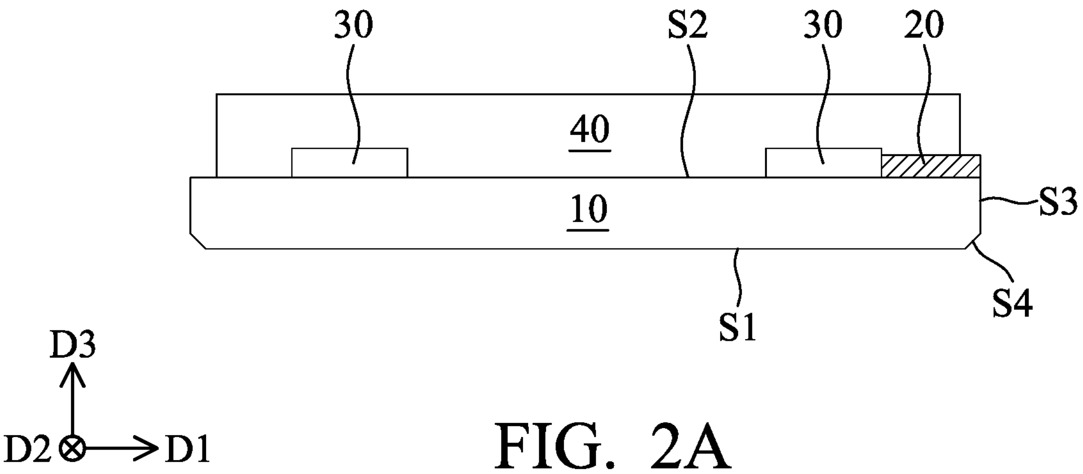
FIG. 2A to FIG. 2F are schematic cross-sectional views respectively showing an electronic device at different stages of a manufacturing method according to some embodiments of the present disclosure.
Figure 2B:
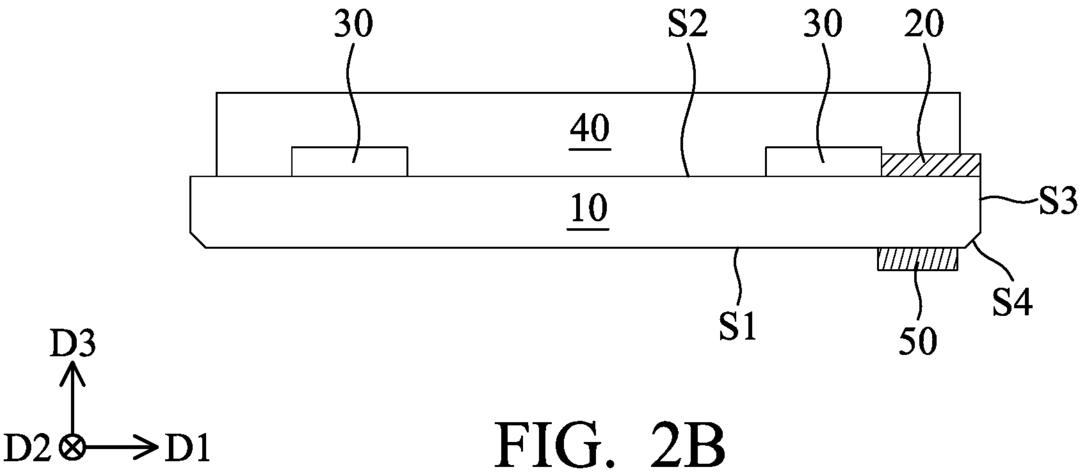
Figure 2C:
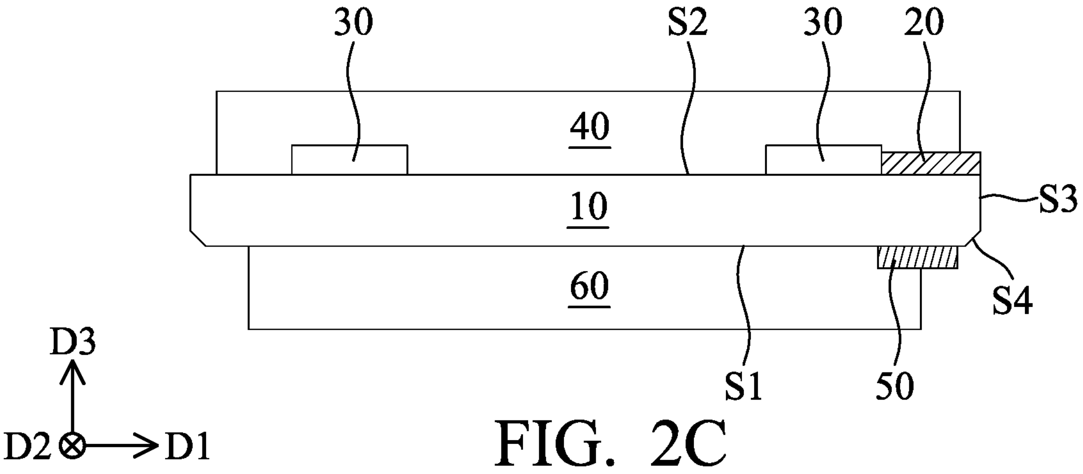
Figure 2D:
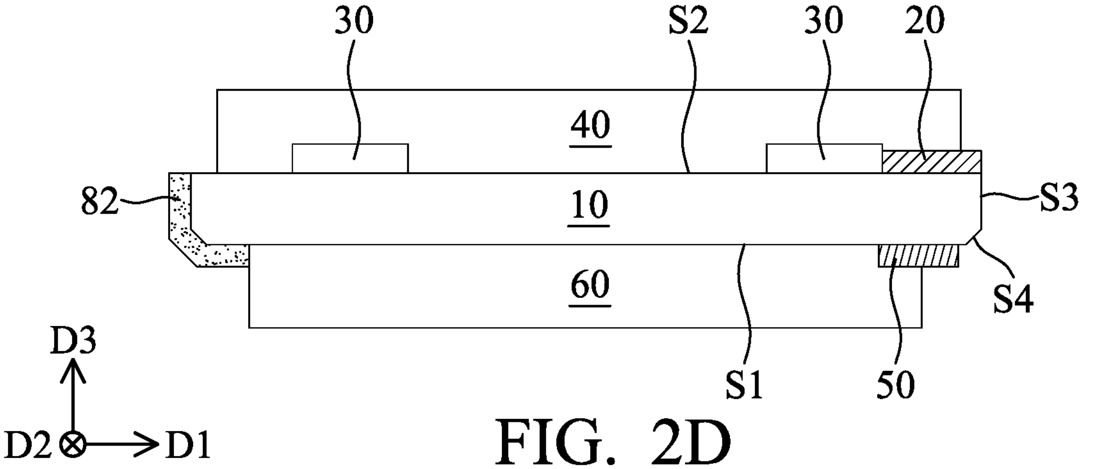

Continuing the above, as shown in FIG. 2D, in some embodiments, a photoresist layer 82 is formed on the side surface S3 and the chamfered surface S4 of the first substrate 10 where the first conductive pattern 50 is not disposed. In some embodiments, the photoresist layer 82 may be a negative photoresist, but the present disclosure is not limited thereto.

Figure 2E:
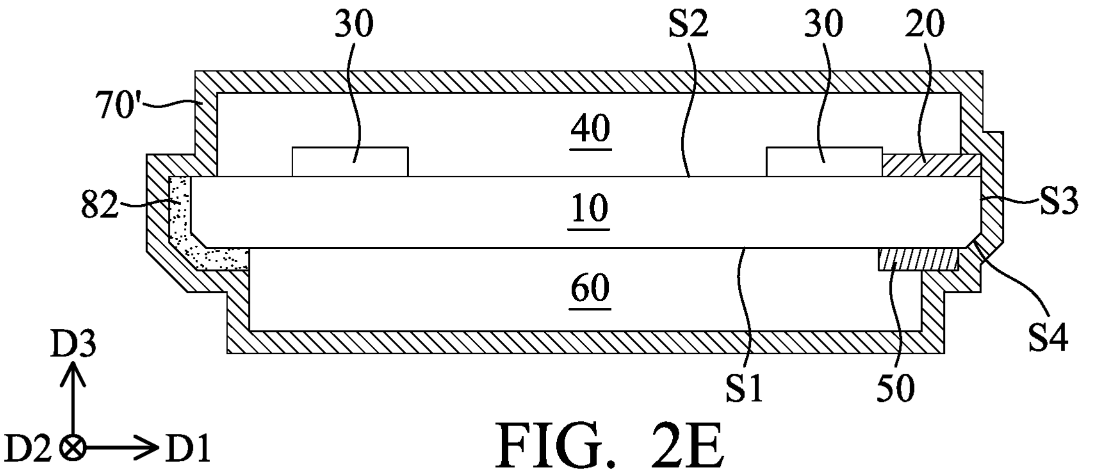

As shown in FIG. 2E, in some embodiments, the conductive layer 70' is formed on the photoresist layer 82, the second protective film 40, the second conductive pattern 20, the side surface S3, the chamfered surface S4, the first conductive pattern 50, and the first protective film 60.

Figure 2F:
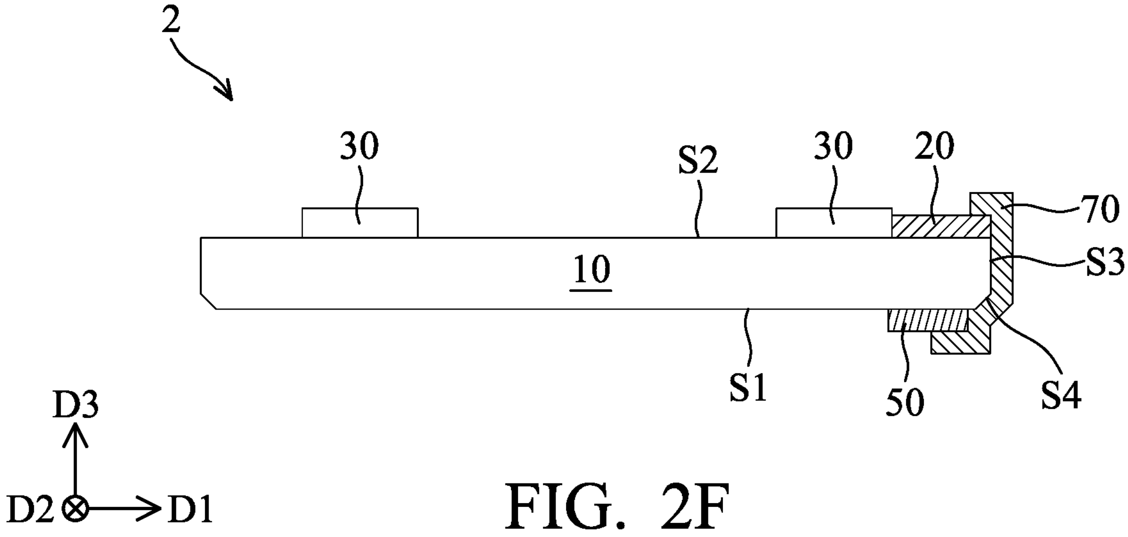

As shown in FIG. 2F, in some embodiments, the lift-off process is performed to remove the conductive layer 70' disposed on the photoresist layer 82 to form the side conductive pattern 70. Specifically, the second protective film 40, the first protective film 60, and the photoresist layer 82 are removed, and the conductive layer 70' located on the second protective film 40, the first protective film 60, and the pattern of the photoresist layer 82 are also removed. Thus, the electronic device 2 having the specific side conductive pattern 70 is obtained. In the following, the formation method of the side conductive pattern 70 will be described in detail with reference to FIG. 3A to FIG. 3E.

Referring to FIG. 3A to FIG. 3E, they are schematic bottom views respectively showing a side conductive pattern 70 of an electronic device 2 at different stages of a manufacturing method according to some embodiments of the present disclosure. Hereinafter, with reference to FIG. 3A to FIG. 3E, the formation methods of the side conductive pattern 70 having an overlapping portion with the first conductive pattern 50 are described by taking the first conductive pattern 50, the first protective film 60, and the side conductive pattern 70 as an example, but the present disclosure is not limited thereto.

Figure 3A:
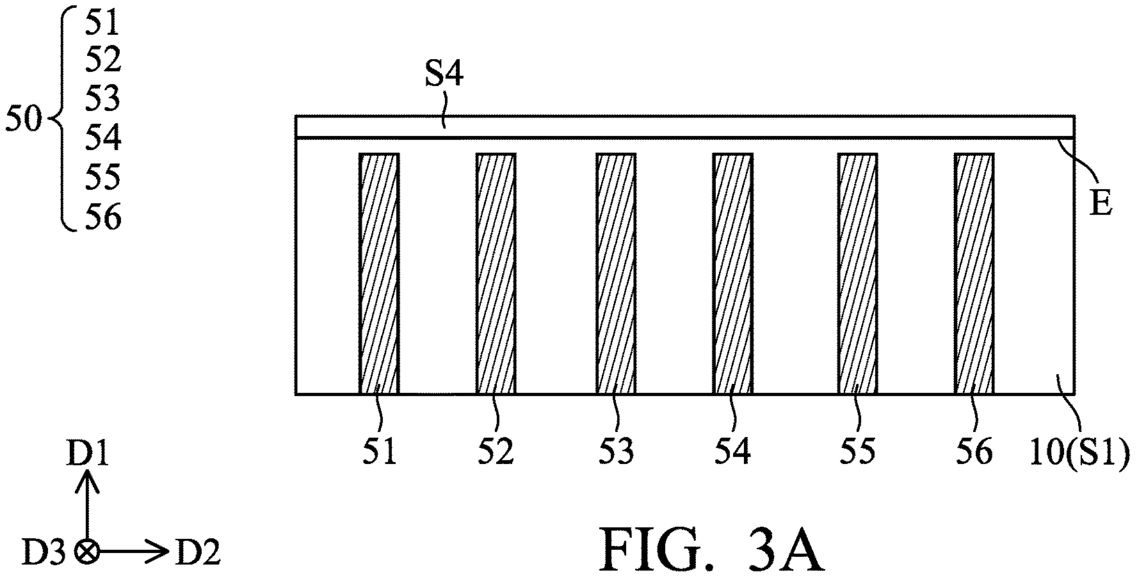
FIG. 3A to FIG. 3E are schematic bottom views respectively showing a side conductive pattern of an electronic device at different stages of a manufacturing method according to some embodiments of the present disclosure.

As shown in FIG. 3A (corresponding to FIG. 2B), in some embodiments, the first conductive pattern 50 may include at least two conductive lines when viewed in a bottom view. In some embodiments, the number of conductive lines of the first conductive pattern 50 may be adjusted to meet requirements. As shown in FIG. 3A, the first conductive pattern 50 has six conductive lines 51 to 56 as an example, but the present disclosure is not limited thereto. For example, the first conductive pattern 50 may have any positive integer number of conductive lines greater than 2. In some embodiments, each of the conductive lines 51 to 56 extends along the first direction D1, and each of the conductive lines 51 to 56 is arranged along the second direction D2. There may be intervals between two of the conductive lines 51 to 56 that are adjacent to each other (between two adjacent conductive lines 51 to 56). The ends of the conductive lines 51 to 56 may or may not be aligned with the edge E.

Figure 3B:
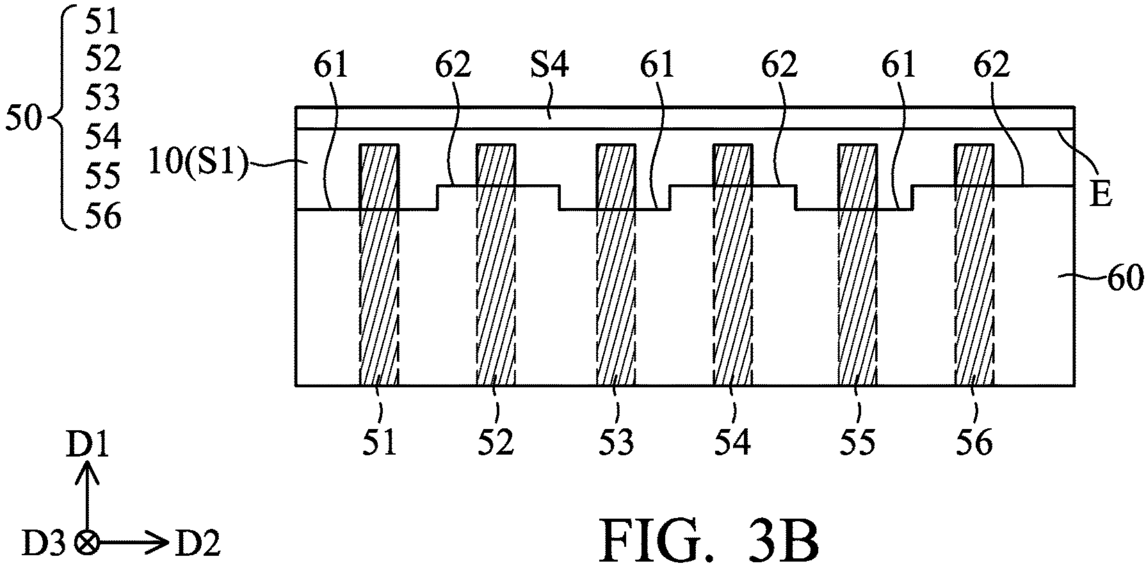

As shown in FIG. 3B (corresponding to FIG. 2C), in some embodiments, the first protective film 60 is formed on the first conductive pattern 50. That is, the first protective film 60 may cover a portion of the first conductive pattern 50 and expose another portion of the first conductive pattern 50. In some embodiments, in the first direction D1, the edge of the first protective film 60 adjacent to the edge of the first substrate 10 may have a zigzag shape, a waved shape, or other suitable shapes, but the present disclosure is not limited thereto. In the bottom view of some embodiments, the edge of the first protective film 60 has at least one concave portion 61 and at least one convex portion 62 on the first surface S1 of the first substrate 10, and the at least one convex portion 62 and the at least one concave portion 61 are arranged adjacent to each other. For example, in the first direction D1, the convex portion 62 is closer to the edge of the first substrate 10 than the concave portion 61. In some embodiments, in the second direction D2, the concave portion 61 and the convex portion 62 are arranged at intervals. In some embodiments, each of the concave portion 61 and the convex portion 62 may correspond to a conductive line of the first conductive pattern 50 respectively. Since the edge of the first protective film 60 may have a shape corresponding to the concave portion 61 and the convex portion 62, it is beneficial to subsequently remove the first protective film 60 and/or improve the yield of the subsequently formed side conductive pattern 70. For example, the concave portion 61 and the convex portion 62 may reduce the area of the subsequent conductive layer 70' formed on the first protective film 60, thereby making the first protective film 60 easier to be lifted off.

Figure 3C:
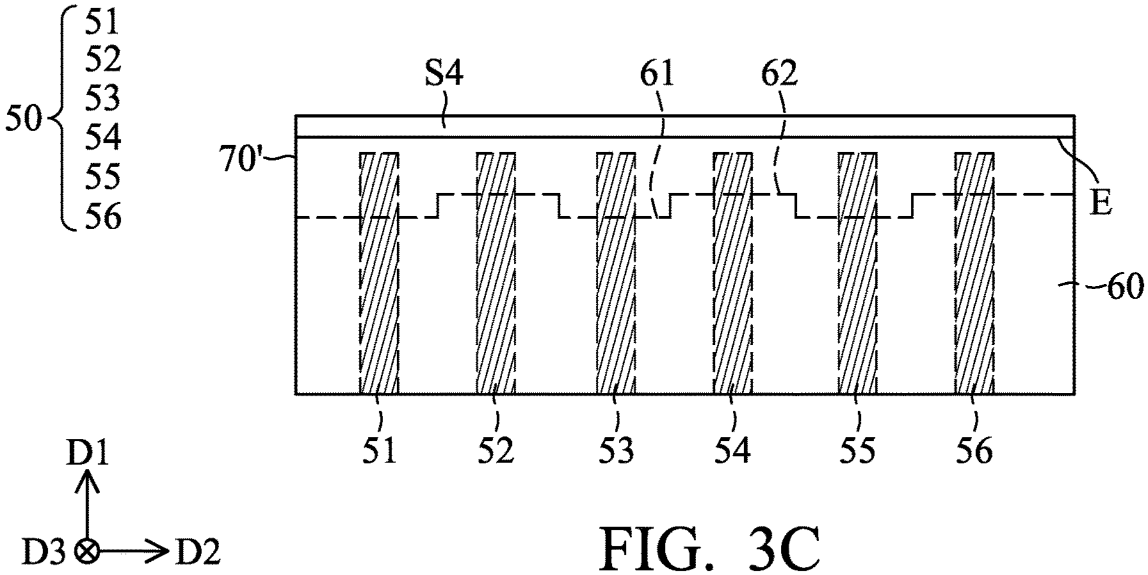

As shown in FIG. 3C (corresponding to FIG. 2E), in some embodiments, a conductive layer 70' is formed on the first protective film 60 and the first conductive pattern 50 on the first surface S1 of the first substrate 10. In other words, the conductive layer 70' may cover the first protective film 60, and may cover a portion of the first conductive pattern 50 exposed by the first protective film 60.

Figure 3D:
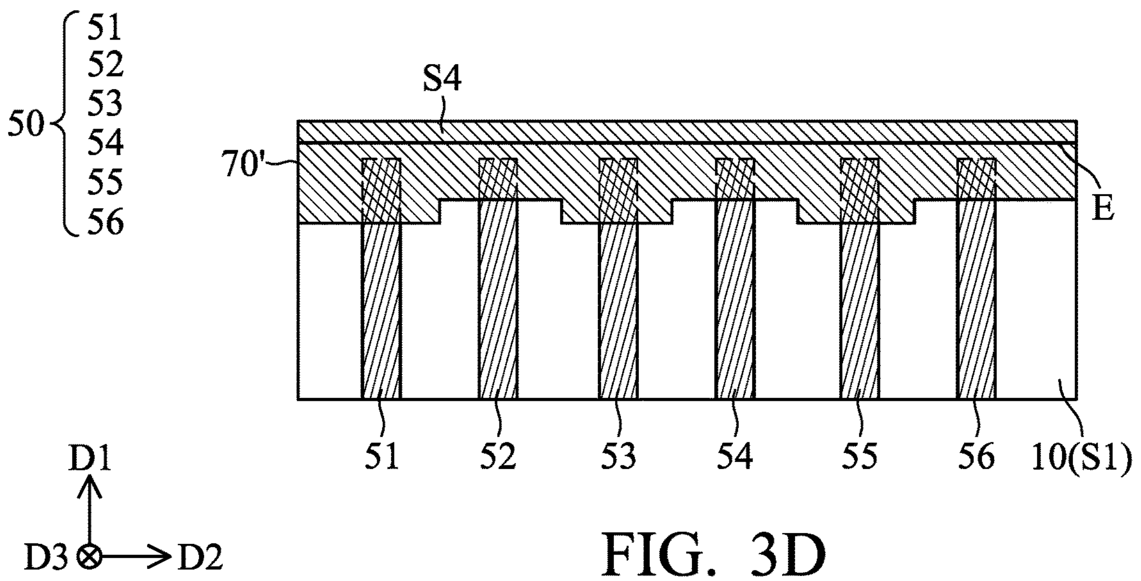

As shown in FIG. 3D (corresponding to FIG. 2F), in some embodiments, the first protective film 60 is removed, and the conductive layer 70' formed on the first protective film 60 is correspondingly removed, while the conductive layer 70' on the first conductive pattern 50 is remained. Therefore, the conductive layer 70' formed on the first conductive pattern 50 may have a shape corresponding to the concave portion 61 and the convex portion 62 of the first protective film 60. In addition, the conductive layer 70' remaining on the first conductive pattern 50 and the first conductive pattern 50 may be electrically connected to each other.

Figure 3E:
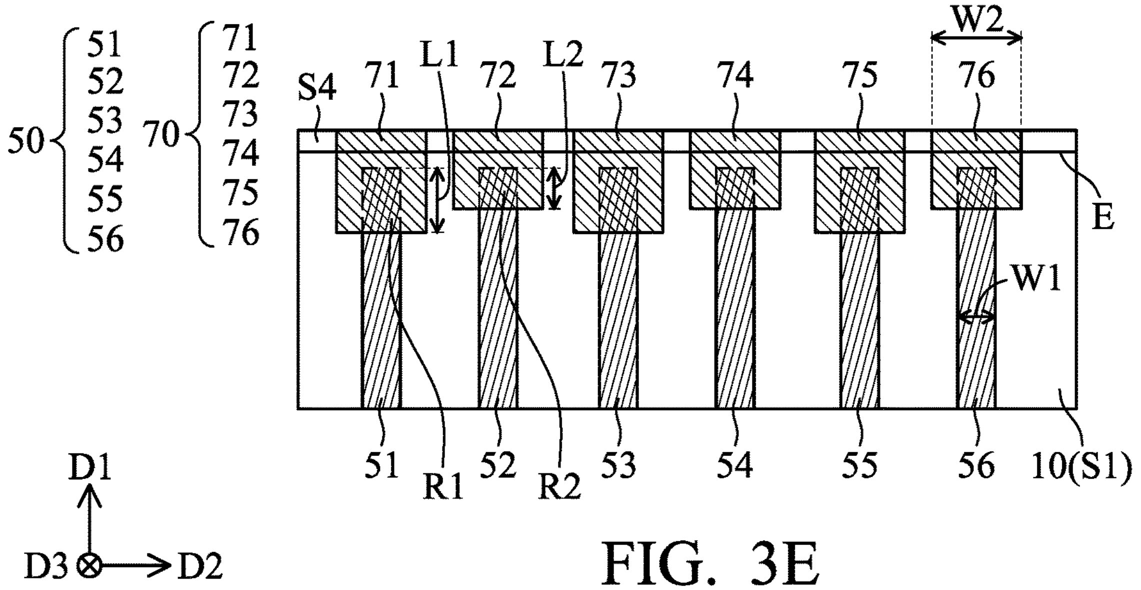

As shown in FIG. 3E, in some embodiments, the conductive layer 70' is patterned to form the side conductive pattern 70. Specifically, the conductive layer 70' is patterned to form side conductive lines 71 to 76 that are separated from each other. For example, the conductive layer 70' may be patterned by the laser process. Therefore, the side conductive pattern 70 may include at least two side conductive lines. In some embodiments, the number of conductive lines of the side conductive pattern 70 may be adjusted to meet requirements. As shown in FIG. 3E, the side conductive pattern 70 has six side conductive lines 71 to 76 as an example, but the present disclosure is not limited thereto. For example, the side conductive pattern 70 may have any positive integer number of side conductive lines greater than 2. In some embodiments, each of the side conductive lines 71 to 76 extends along the first direction D1 and the third direction D3, each of the side conductive lines 71 to 76 is arranged along the second direction D2. There may be intervals between two adjacent side conductive lines. In some embodiments, one of the side conductive lines 71 to 76 may correspond to one of the conductive lines 51 to 56. In some embodiments, in the third direction D3, the side conductive pattern 70 including the side conductive lines 71 to 76 may overlap (or cover) a portion of the first conductive pattern 50 including the conductive lines 51 to 56. In other embodiments, in the third direction D3, the first conductive pattern 50 including the conductive lines 51 to 56 may cover a portion of the side conductive pattern 70 including the side conductive lines 71 to 76 (referring to FIG. 4F).

As shown in FIG. 3E, hereinafter, the side conductive line 71 of the side conductive pattern 70 is referred as a first side conductive lines and the side conductive line 72 of the side conductive pattern 70 is referred as s second side conductive lines as an example for illustration, but the present disclosure is not limited thereto. In some embodiments, in the first direction D1, the first overlapping portion R1 of the first side conductive line 71 and the conductive line 51 of the first conductive pattern 50 may have a first length L1, and the second overlapping portion R2 of the first side conductive line 71 and the conductive line 52 of the first conductive pattern 50 may have a second length L2, and the first length L1 is different from the second length L2. In some embodiments, the first length L1 may be greater than or less than the second length L2.

In some embodiments, the first length L1 may be greater than or equal to 10 micrometers (um) and less than or equal to 100 micrometers (10 micrometers≤L1≤100 micrometers). For example, the first length L1 may be 10 micrometers, 20 micrometers, 30 micrometers, 40 micrometers, 50 micrometers, 60 micrometers, 70 micrometers, 80 micrometers, 90 micrometers, 100 micrometers, or any value or any range of values between the aforementioned values, but the present disclosure is not limited thereto. In some embodiments, the second length L2 may be greater than or equal to 10 micrometers and less than or equal to 100 micrometers (10 micrometers≤L2≤100 micrometers). For example, the second length L2 may be 10 micrometers, 20 micrometers, 30 micrometers, 40 micrometers, 50 micrometers, 60 micrometers, 70 micrometers, 80 micrometers, 90 micrometers, 100 micrometers, or any value or any range of values between the aforementioned values, but the present disclosure is not limited thereto. In some embodiments, the difference between the first length L1 and the second length L2 (|L1−L2|) may be greater than or equal to 1 micrometers and less than or equal to 50 micrometers (1 micrometers≤|L1−L2|≤50 micrometers). For example, the difference between the first length L1 and the second length L2 may be 1 micrometers, 5 micrometers, 10 micrometers, 15 micrometers, 20 micrometers, 25 micrometers, 30 micrometers, 35 micrometers, 40 micrometers, 45 micrometers, 50 micrometers, or any value or any range of values between the aforementioned values, but the present disclosure is not limited thereto.

In some embodiments, in the second direction D2, (each of) the conductive lines 51 to 56 may have a first width W1, (each of) the side conductive lines 71 to 76 may have a second width W2, and the second width W2 may be greater than the first width W1. In some embodiments, the ratio of the second width W2 to the first width W1 (the second width W2/the first width W1) may be greater than 1 and less than or equal to 2 (1<W2/W1≤2). For example, the ratio of the second width W2 to the first width W1 may be 1.1, 1.25, 1.5, 1.75, 2, or any value or any value range between the aforementioned values, but the present disclosure is not limited thereto. Since the second width W2 may be greater than the first width W1, the process margin (or the process window) of formation of the side conductive pattern 70 on the first conductive pattern 50 may be improved and/or the complexity of the alignment process may be reduced, thereby improving the reliability of the electronic device.

Figure 3F:
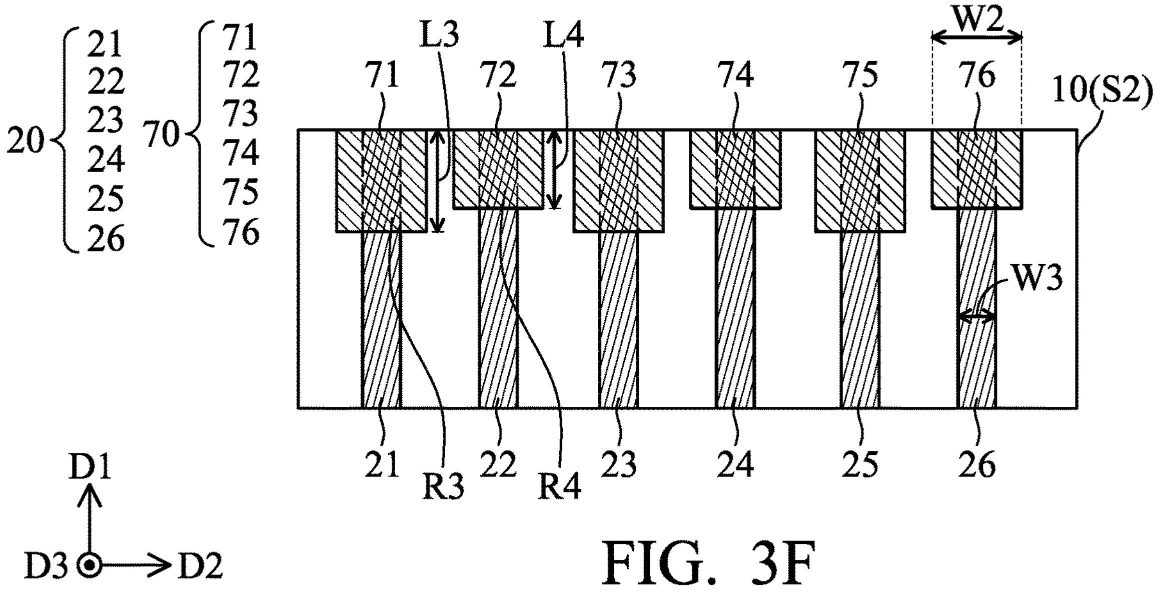
FIG. 3F is a schematic top view showing a side conductive pattern of an electronic device according to some embodiments of the present disclosure.

Referring to FIG. 3F, it is a schematic top view showing a side conductive pattern 70 of an electronic device according to some embodiments of the present disclosure. As shown in FIG. 3F, the formation method of the side conductive pattern 70 having an overlapping portion overlapping the second conductive pattern 20 is similar to the content of the aforementioned FIG. 3A to FIG. 3E.

As shown in FIG. 3F, in some embodiments, when viewed from a top view, the second conductive pattern 20 may include at least two conductive lines. In some embodiments, the number of conductive lines of the second conductive pattern 20 may be adjusted to meet requirements. As shown in FIG. 3F, the second conductive pattern 20 has six conductive lines 21 to 26. This is provided as an example, and the present disclosure is not limited thereto. For example, the second conductive pattern 20 may have any number of conductive lines, provided that number is a positive integer greater than 2. In some embodiments, each of the conductive lines 21 to 26 extends along the first direction D1, each of the conductive lines 21 to 26 is arranged along the second direction D2, and there is an interval between two adjacent conductive lines. It should be noted that, although it is not shown in the drawings, as mentioned above, there may be another chamfered surface between the second surface S2 and the side surface S3. There is also an edge between the chamfered surface and the second surface S2, and the second conductive pattern 20 may extend or may not extend to the edge. When there may be the chamfered surface between the second surface S2 and the side surface S3, the relevant description of the chamfered surface may be the same as or similar to that of the aforementioned chamfered surface S4, and will not be repeated here.

In some embodiments, in the third direction D3, the side conductive pattern 70 including the side conductive lines 71 to 76 may overlap (or cover) a portion of the second conductive pattern 20 including the conductive lines 21 to 26. In some embodiments, in the first direction D1, the side conductive pattern 70 and at least two of the conductive lines 21 to 26 of the second conductive pattern 20 have a third overlapping portion and a fourth overlapping portion, respectively. As shown in FIG. 3F, the conductive lines 21 to 26 may extend to the edge of the first substrate 10, but the present disclosure is not limited thereto. In the following, the side conductive line 71 of the side conductive pattern 70 is referred as a first side conductive line and the side conductive line 72 of the side conductive pattern 70 is referred as a second side conductive line as an example for illustration, but the present disclosure is not limited thereto. In some embodiments, in the first direction D1, the third overlapping portion R3 of the first side conductive line 71 and the conductive line 21 of the second conductive pattern 20 may have a third length L3, and the fourth overlapping portion R4 of the second side conductive line 72 and the conductive line 22 of the second conductive pattern 20 may have a fourth length L4, and the third length L3 is different from the fourth length L4. In some embodiments, the third length L3 may be greater than or less than the fourth length L4.

In some embodiments, the third length L3 may be greater than or equal to 10 micrometers and less than or equal to 100 micrometers (10 micrometers≤L3≤100 micrometers). In some embodiments, the fourth length L4 may be greater than or equal to 10 micrometers and less than or equal to 100 micrometers (10 micrometers≤L4≤100 micrometers). In some embodiments, the difference between the third length L3 and the fourth length L4 (|L3−L4|) may be greater than or equal to 1 micrometers and less than or equal to 50 micrometers (1 micrometers≤|L3−L4|≤50 micrometers).

In some embodiments, in the second direction D2, (each of) the conductive lines 21 to 26 may have a third width W3, and the second width W2 may be greater than the third width W3. In some embodiments, the ratio of the second width W2 to the third width W3 (the second width W2/the third width W3) may be greater than 1 and less than or equal to 2 (1<W2/W3≤2). For example, the ratio of the second width W2 to the third width W3 may be 1.1, 1.25, 1.5, 1.75, 2, or any value or any value range between the aforementioned values, but the present disclosure is not limited thereto. Since the second width W2 may be greater than the third width W3, the process margin of formation of the side conductive pattern 70 on the second conductive pattern 20 may be improved and/or the complexity of the alignment process may be reduced, thereby improving reliability of the electronic device.

Figure 3G:
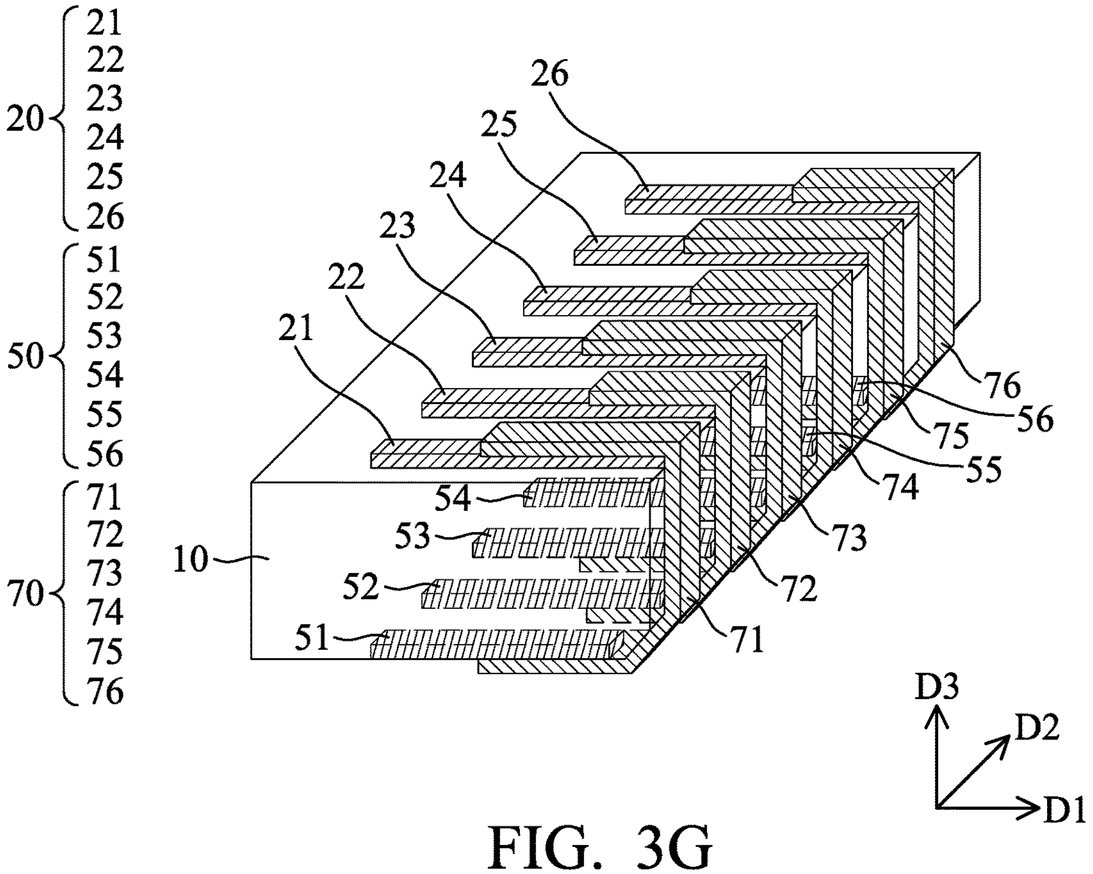
FIG. 3G and FIG. 3H are schematic three-dimensional diagrams respectively showing an electronic device according to some embodiments of the present disclosure.
Figure 3H:
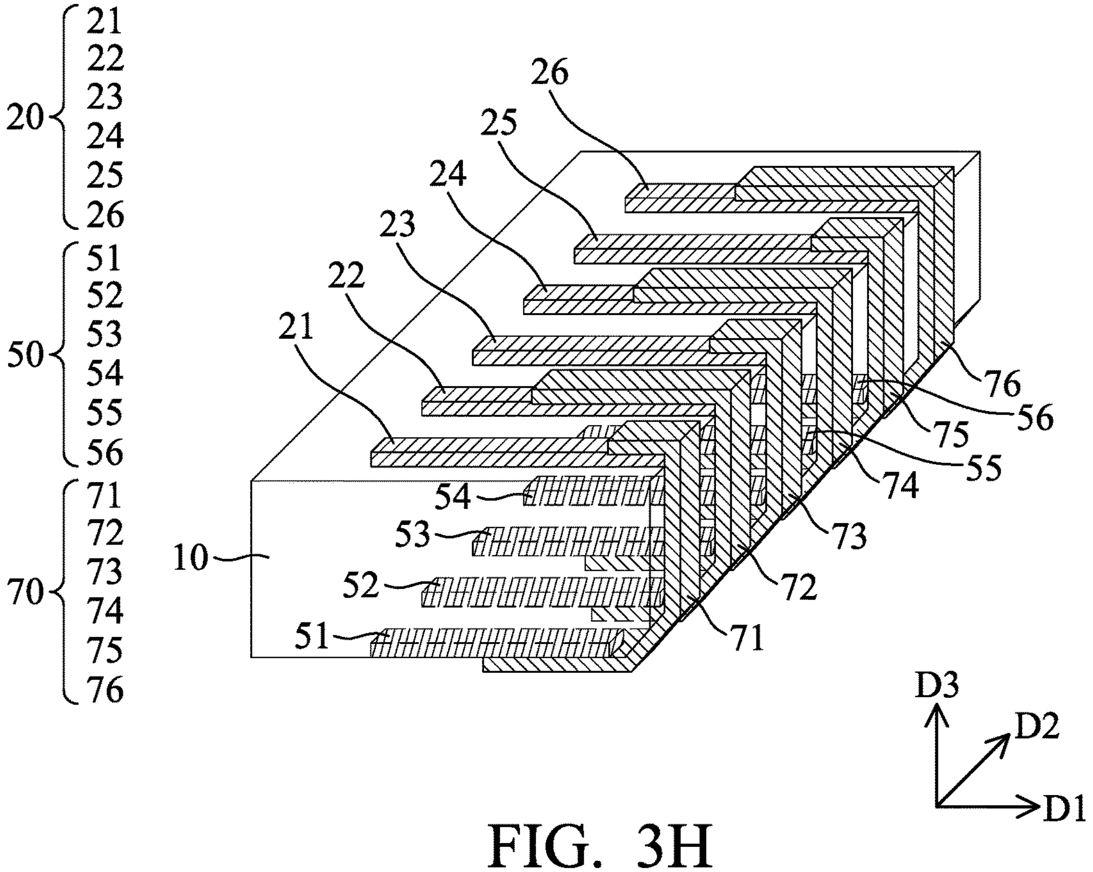

FIG. 3G and FIG. 3H are schematic three-dimensional diagrams respectively showing an electronic device according to some embodiments of the present disclosure. As shown in FIG. 3G, in some embodiments, the first length L1 of the first overlapping portion R1 of the first side conductive line 71 may be greater than the second length L2 of the second overlapping portion R2 of the second side conductive line 72, and the third length L3 of the third overlapping portion R3 of the first side conductive line 71 may be greater than the fourth length L4 of the fourth overlapping portion R4 of the second side conductive line 72. As shown in FIG. 3H, in some embodiments, the first length L1 of the first overlapping portion R1 of the first side conductive line 71 may be greater than the second length L2 of the second overlapping portion R2 of the second side conductive line 72, and the third length L3 of the third overlapping portion R3 of the first side conductive line 71 may be less than the fourth length L4 of the fourth overlapping portion R4 of the second side conductive line 72.

FIG. 4A to FIG. 4F are schematic cross-sectional views respectively showing an electronic device 3 at different stages of a manufacturing method according to some embodiments of the present disclosure. The content shown in FIG. 4A corresponds to the content shown in the aforementioned FIG. 1A.

Figure 4A:
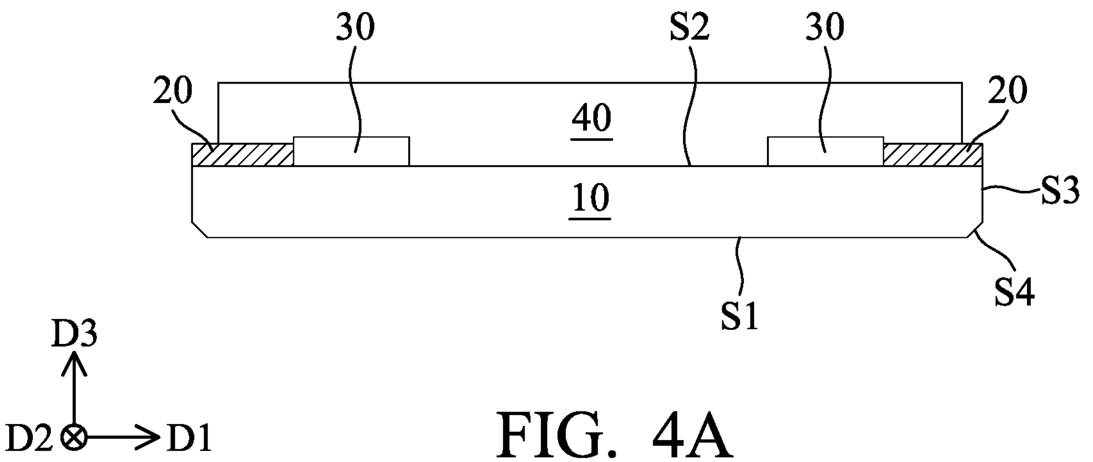
FIG. 4A to FIG. 4F are schematic cross-sectional views respectively showing an electronic device at different stages of a manufacturing method according to some embodiments of the present disclosure.
Figure 4B:
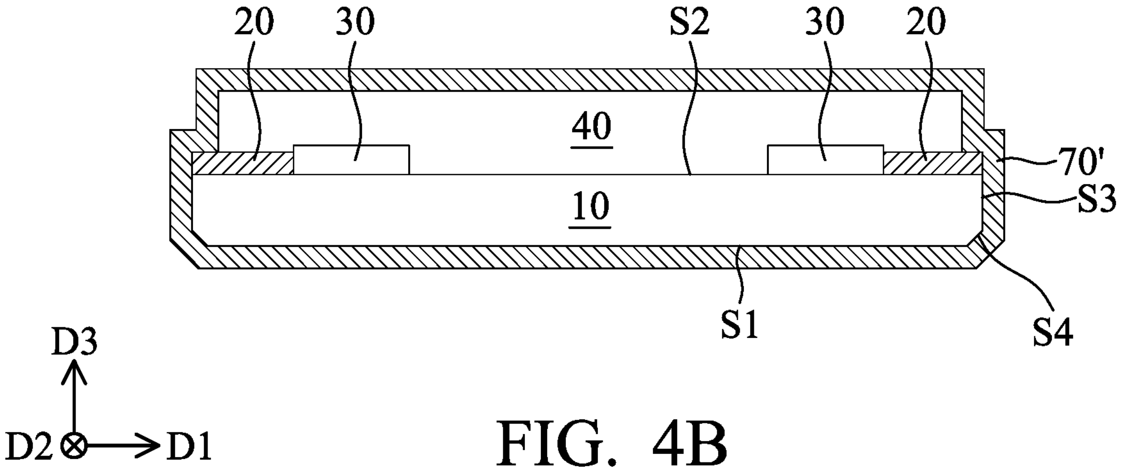

Continuing from the above, as shown in FIG. 4B, in some embodiments, the first protective film 60 may be omitted. Therefore, when the first protective film 60 is not formed on the first surface S1 of the first substrate 10, the conductive layer 70' is formed on the second protective film 40, the second conductive pattern 20, the side surface S3, the chamfered surface S4, and the first surface S1.

Figure 4C:
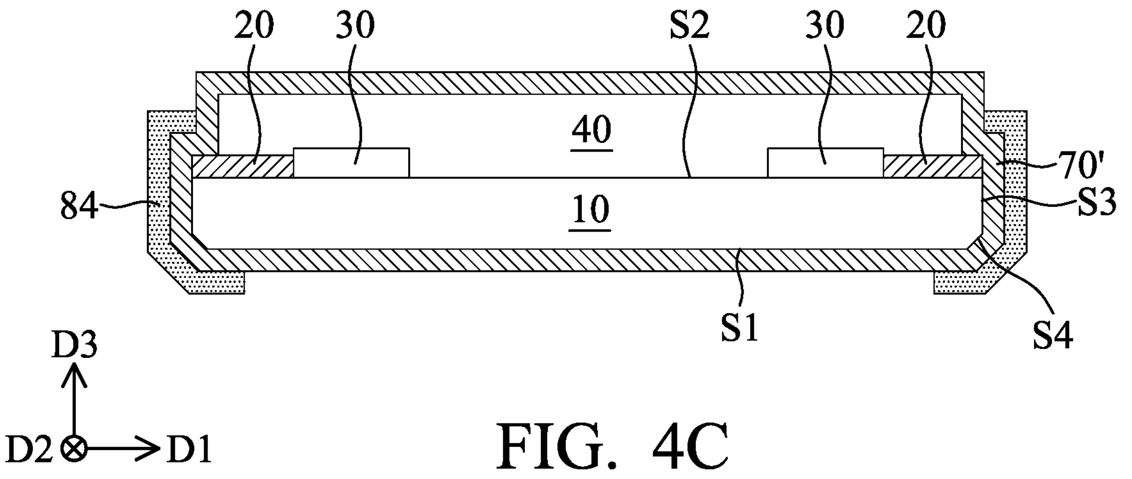

As shown in FIG. 4C, in some embodiments, a photoresist layer 84 is formed on the conductive layer 70'. In some embodiments, the photoresist layer 84 may be a positive photoresist. In some embodiments, the photoresist layer 84 may cover the side surface S3 of the first substrate 10, and the photoresist layer 80 may expose the conductive layer 70' on the top surface of the second protective film 40 and the conductive layer 70' on the first surface S1 of the first substrate 10.

Figure 4D:
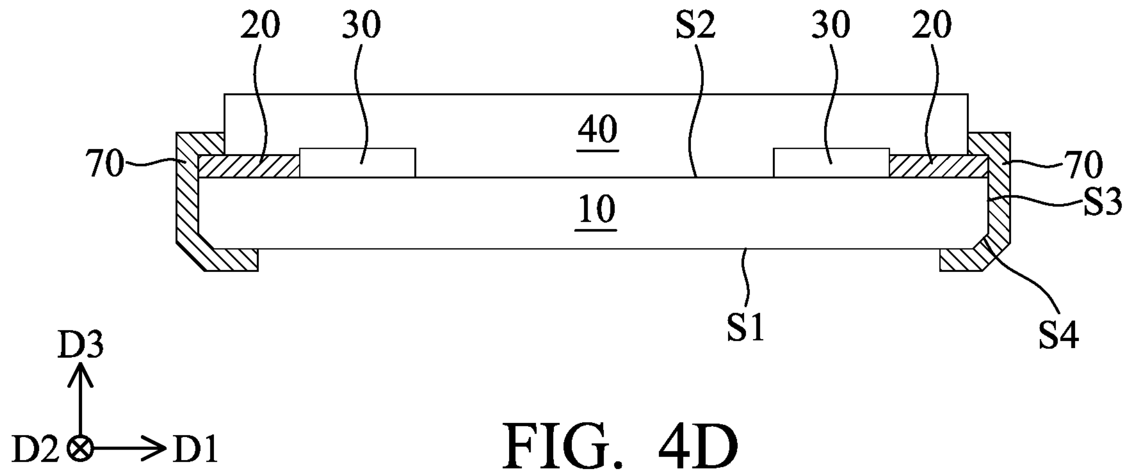

As shown in FIG. 4D, in some embodiments, an etching process is performed to remove the conductive layer 70' not covered by the photoresist layer 84 to form the side conductive pattern 70.

Figure 4E:
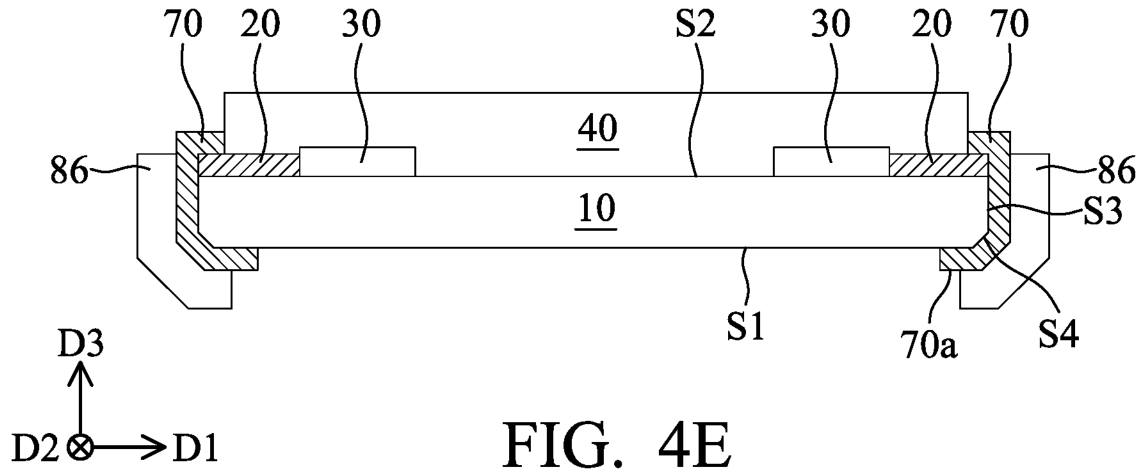

As shown in FIG. 4E, in some embodiments, a third protective film 86 is formed on the side conductive pattern 70. In some embodiments, the material and formation method of the third protective film 86 may be the same as or different from the materials and formation method of the first protective film 60 and/or the second protective film 40. In some embodiments, the third protective film 86 may cover the side surface of the side conductive pattern 70, and the third protective film 86 may expose the side conductive pattern 70 located on the first surface S1 of the first substrate 10. Therefore, the third protective film 86 may expose the exposed surface 70*a* of the side conductive pattern 70 that will be electrically connected to the subsequently formed first conductive pattern 50.

Figure 4F:
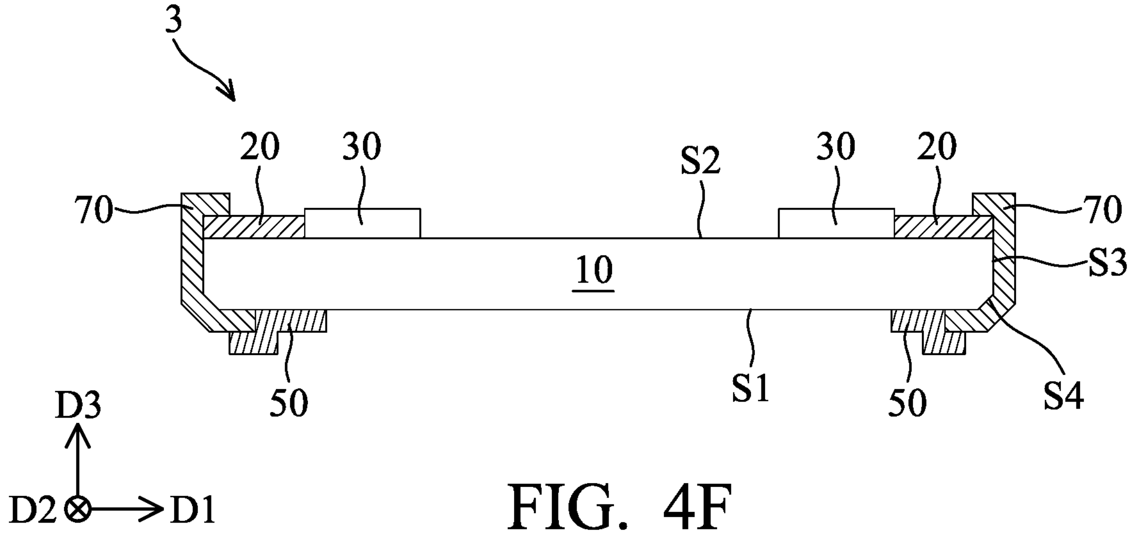

As shown in FIG. 4F, in some embodiments, the first conductive pattern 50 is formed on the side conductive pattern 70 exposed by the third protective film 86, so that the first conductive pattern 50 and the side conductive pattern 70 are electrically connected. In some embodiments, the first conductive pattern 50 may cover the bottom surface of the side conductive pattern 70. Then, after the first conductive pattern 50 is formed, the second protective film 40 and the third protective film 86 are removed, and the electronic device 3 is obtained.

In some embodiments, a transfer process of electronic elements such as light-emitting diodes may be further performed on the electronic devices 1, 2, and/or 3 to form the required electronic elements (for example, the light-emitting diodes) on the second surface S2 of the first substrate 10.

FIG. 5A to FIG. 5G are schematic cross-sectional views respectively showing electronic devices 4 and 5 at different stages of a manufacturing method according to some embodiments of the present disclosure. Except that the electronic element 32 is further disposed on the second surface S2 of the first substrate 10, the content shown in FIG. 5A corresponds to the content shown in the aforementioned FIG. 1A.

Figure 5A:
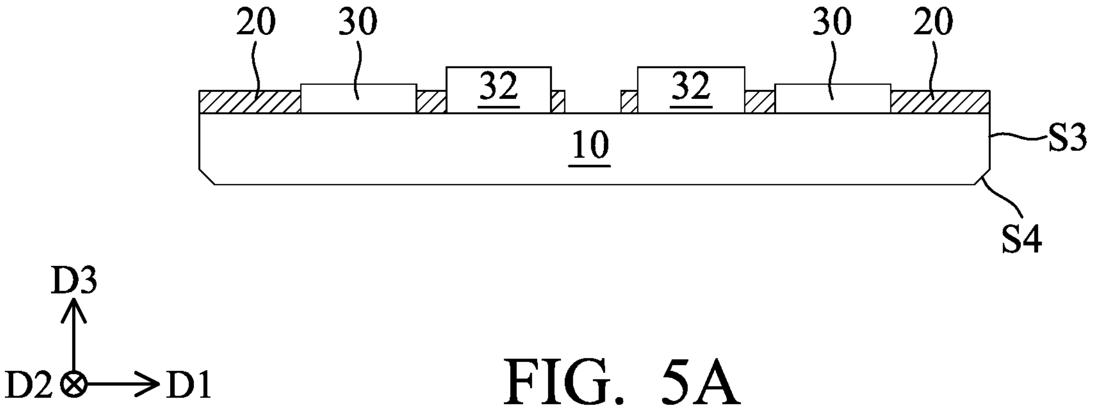
FIG. 5A to FIG. 5G are schematic cross-sectional views respectively showing an electronic device at different stages of a manufacturing method according to some embodiments of the present disclosure.

As shown in FIG. 5A, in some embodiments, an electronic element 32 may be formed on the second surface S2 of the first substrate 10, and the electronic element 32 may be electrically connected to the electronic element 30 and the second conductive pattern 20. In some embodiments, the electronic element 32 may include a light-emitting diode, but the present disclosure is not limited thereto. For example, the electronic element 32 may include organic light-emitting diode (OLED), mini light-emitting diodes (mini LED), micro light-emitting diodes (micro LED), or quantum dot light-emitting diodes (QD-LED or QLED). In some embodiments, the electronic element 30 may drive and/or control the light-emitting function of the electronic element 32. In some embodiments, the electronic element 32 may be formed on the second surface S2 of the first substrate 10 by a light-emitting diode transfer process.

Figure 5B:
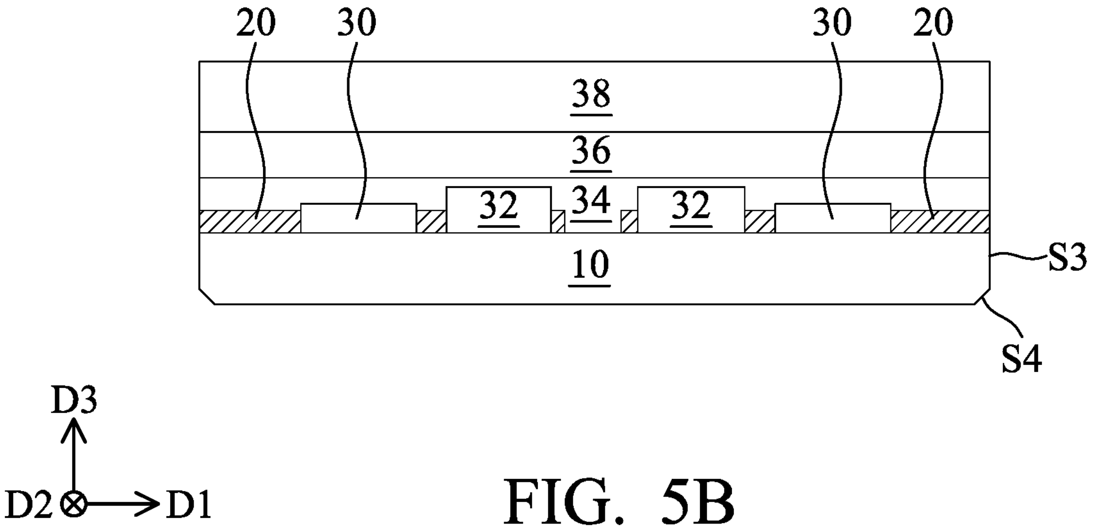

As shown in FIG. 5B, in some embodiments, the second substrate 38 may be disposed on the second surface S2 of the first substrate 10, and the second substrate 38 and the first substrate 10 are bonded. In some embodiments, the functional layer 36 is formed on the second substrate 38, and then the second substrate 38 is bonded to the first substrate 10 by the adhesive layer 34.

In some embodiments, the functional layer 36 may include a light-conversion layer, a color filter layer, a black matrix (BM) layer, a bank layer, or a combination thereof. In some embodiments, the light-conversion layer may include quantum dots, phosphors, or other suitable light-conversion materials, but the present disclosure is not limited thereto. In some embodiments, the color filter layers of different wavelengths may be selected according to requirements. For example, the color filter layer may be a red light filter layer, a green light filter layer, a blue light filter layer, or a combination thereof, but the present disclosure is not limited thereto. In some embodiments, the functional layer 36 may be a quantum dot color filter (QDCF).

In some embodiments, the adhesive layer 34 may be disposed between the first substrate 10 and the second substrate 38. In some embodiments, the adhesive layer 34 may be disposed on the second conductive pattern 20, the electronic element 30, and the electronic element 32 to cover the second conductive pattern 20, the electronic element 30, and the electronic element 32, so as to provide the adhesion for other components such as the functional layer 36 and the like. In some embodiments, the adhesive layer 34 may include optically clear adhesive (OCA), optical clear resin (OCR), other suitable adhesive materials, or a combination thereof, but the present disclosure is not limited thereto.

Figure 5C:
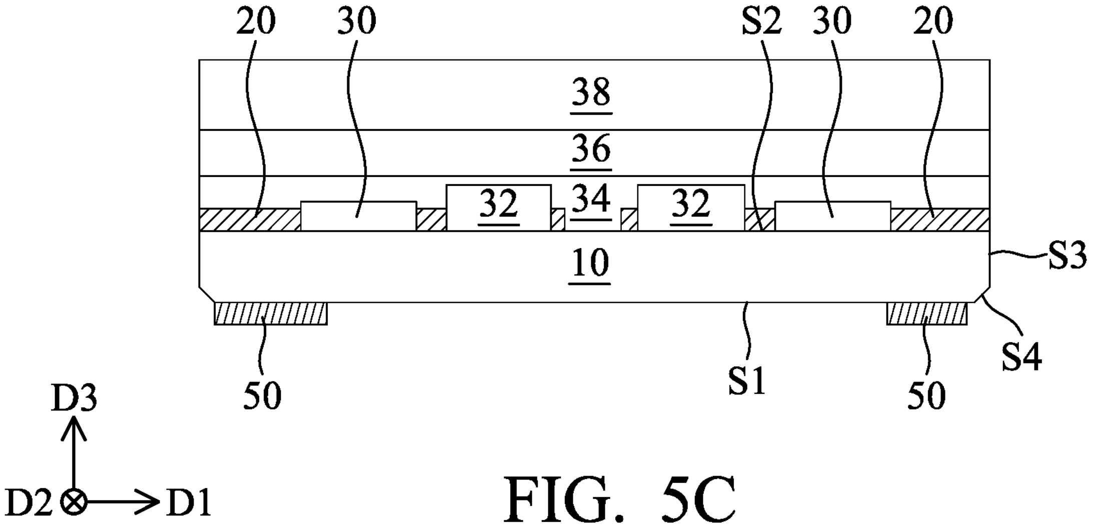
Figure 5D:
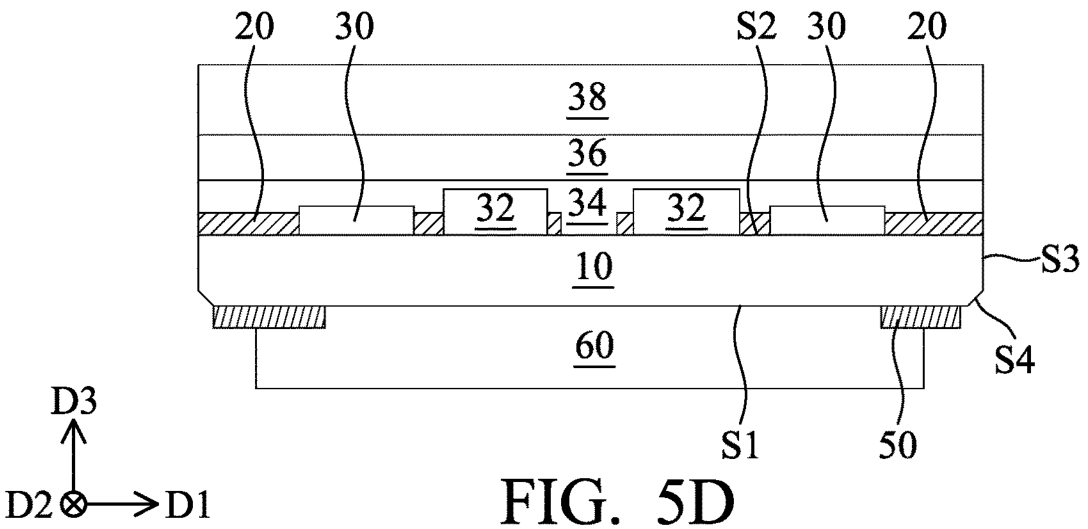
Figure 5E:
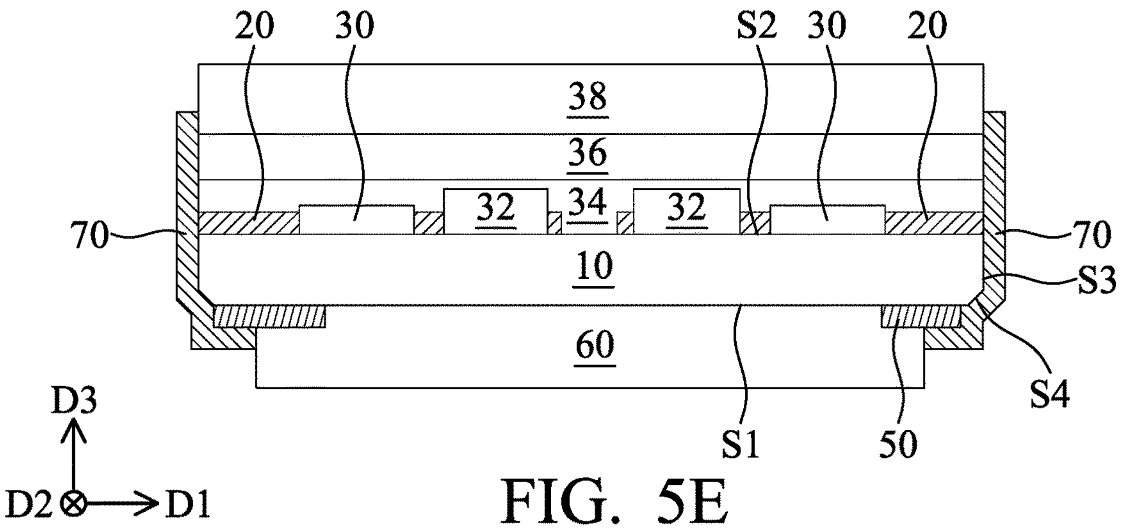
Figure 5F:
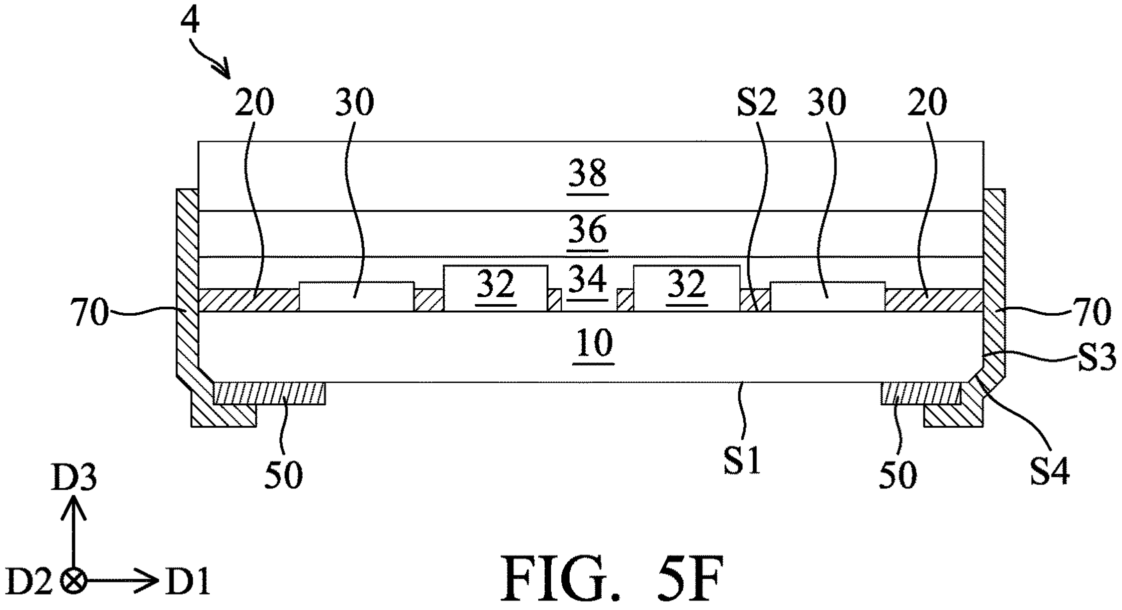

As shown in FIG. 5C, in some embodiments, a first conductive pattern 50 may be formed on the first surface S1 of the first substrate 10. As shown in FIG. 5D, in some embodiments, a first protective film 60 may be formed on the first conductive pattern 50 and the first surface S1 of the first substrate 10. As shown in FIG. 5E, in some embodiments, the side conductive pattern 70 may be formed on the side surface S3 of the first substrate 10, and the side conductive pattern 70 is electrically connected to the second conductive pattern 20 and the first conductive pattern 50. In some embodiments, the side conductive pattern 70 may extend to the side surface of the second substrate 38 in the third direction D3, but the present disclosure is not limited thereto. In some embodiments, the side conductive pattern 70 may extend in the third direction D3 at least to contact the second conductive pattern 20. As shown in FIG. 5F, in some embodiments, the first protective film 60 may be removed to expose the first surface S1 of the first substrate 10, and the electronic device 4 is obtained.

In other embodiments, similar to the electronic device 3, the first conductive pattern 50 may be formed after the side conductive pattern 70 of the electronic device 4 is formed. In other embodiments, the formation method of the side conductive pattern 70 of the electronic device 4 may be the same as or different from the formation method of the side conductive pattern 70 of the electronic device 1 or 2.

Figure 5G:
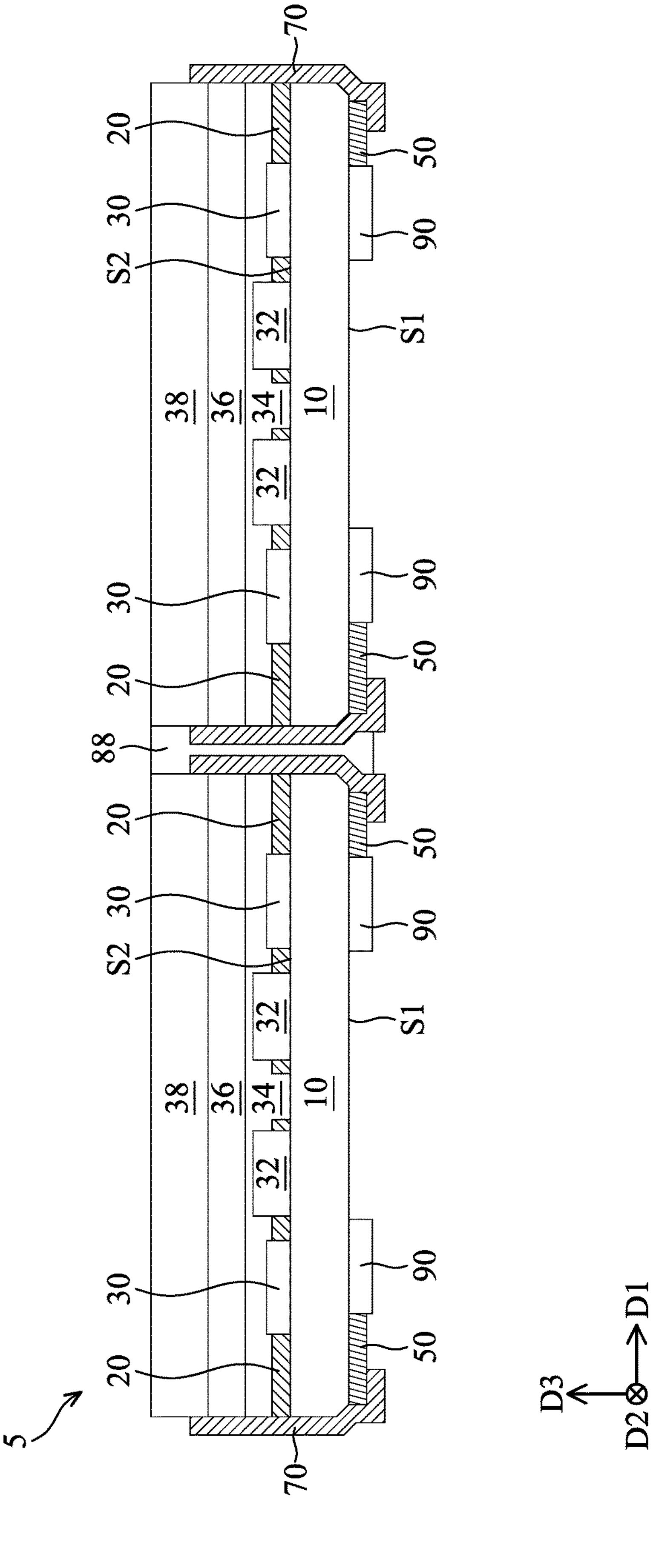

As shown in FIG. 5G, in some embodiments, at least two electronic devices 1 to 4 may be spliced to form an electronic device 5. As shown in FIG. 5G, the electronic device 5 includes two electronic devices 4 as an example, but the present disclosure is not limited thereto. In some embodiments, the electronic device 5 may include at least two electronic devices 1 to 4. For example, the electronic device 5 may include any positive integer number of electronic devices 1 to 4 greater than or equal to 2.

In some embodiments, an adhesive layer 88 may be further formed between adjacent electronic devices 4 to splice the adjacent electronic devices 4. In some embodiments, the electronic element 90 may be further formed on the first surface S1 of the first substrate 10. In some embodiments, the electronic element 90 may be an integrated circuit chip, but the present disclosure is not limited thereto. Accordingly, the electronic device 5 of the present disclosure may splice multiple electronic devices to form a greater-sized spliced electronic device.

In summary, according to some embodiments of the present disclosure, electronic devices and manufacturing methods thereof are provided. By disposing the side conductive pattern and causing the overlapping portions of the side conductive pattern and the first conductive pattern to have different lengths, problems such as short-circuits, open-circuits, and/or excessive impedance may be reduced. For example, since the first overlapping portion has a first length and the second overlapping portion has a second length which is different from the first length, the interval between adjacent side conductive lines may be increased to avoid the problem of short-circuits. For example, since the conductive line has a first width and the side conductive line has a second width which is different from the first width, the reliability of the electrical connection may be improved and the problem of open-circuits may be avoided. For example, since the first conductive pattern, the second conductive pattern, and the side conductive pattern may be formed independently (separately), the volume of the conductive material may be increased, thereby reducing the impedance of the electrical connection.

The features among the various embodiments may be arbitrarily combined as long as they do not violate or conflict with the spirit of the disclosure. In addition, the scope of the present disclosure is not limited to the process, machine, manufacturing, material composition, device, method, and step in the specific embodiments described in the specification. A person of ordinary skill in the art will understand current and future process, machine, manufacturing, material composition, device, method, and step from the content disclosed in some embodiments of the present disclosure, as long as the current or future process, machine, manufacturing, material composition, device, method, and step performs substantially the same functions or obtain substantially the same results as the present disclosure. Therefore, the scope of the present disclosure includes the abovementioned process, machine, manufacturing, material composition, device, method, and step. It is not necessary for any embodiment or claim of the present disclosure to achieve all of the objects, advantages, and/or features disclosed herein.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:

a first substrate having a first surface, a second surface opposite to the first surface, and a side surface between the first surface and the second surface;

a first conductive pattern disposed on the first surface; and a side conductive pattern disposed on the side surface and the first surface, wherein the side conductive pattern is electrically connected to the first conductive pattern, and the side conductive pattern comprises a first side conductive line and a second side conductive line, wherein a first overlapping portion of the first side conductive line and the first conductive pattern has a first length, a second overlapping portion of the second side conductive line and the first conductive pattern has a second length, and the first length is different from the second length.

2. The electronic device as claimed in claim 1, wherein the first length is greater than or equal to 10 microns and less than or equal to 100 microns, and the second length is greater than or equal to 10 microns and less than or equal to 100 microns.

3. The electronic device as claimed in claim 1, wherein a difference between the first length and the second length is greater than or equal to 1 micron and less than or equal to 50 microns.

4. The electronic device as claimed in claim 1, further comprising:

a second conductive pattern disposed on the second surface and comprising at least two conductive lines, wherein the side conductive pattern and the at least two conductive lines respectively have a third overlapping portion and a fourth overlapping portion, and the third overlapping portion has a third length, the fourth overlapping portion has a fourth length, and the third length is different from the fourth length.

5. The electronic device as claimed in claim 1, further comprising:

a second substrate disposed on the first substrate; and an adhesive layer disposed between the first substrate and the second substrate, wherein the side conductive pattern extends on a side surface of the second substrate.

6. The electronic device as claimed in claim 5, further comprising a functional layer disposed on the second substrate, and the functional layer includes a light conversion layer, a filter layer, a black matrix layer, a spacer layer, or a combination thereof.

7. The electronic device as claimed in claim 1, wherein the first conductive pattern includes a multi-layer structured conductive film.

8. The electronic device as claimed in claim 1, wherein the side conductive pattern includes a multi-layer structured conductive film.

9. The electronic device as claimed in claim 1, wherein the first substrate further comprises at least one chamfered surface, and the at least one chamfered surface is located between the first surface and the side surface.

10. The electronic device as claimed in claim 9, wherein a number of the at least one chamfered surface is greater than or equal to 2.

11. The electronic device as claimed in claim 9, wherein a virtual extension line of the at least one chamfered surface and a virtual extension line of the first surface have an included angle, and an angle of the included angle is greater than or equal to 30 degrees and less than or equal to 60 degrees.

12. The electronic device as claimed in claim 1, further comprising:

a second conductive pattern disposed on the second surface; and an electronic element disposed on the second surface and electrically connected to the second conductive pattern.

* * * * *